(12) United States Patent
Itabashi et al.

(10) Patent No.: US 7,924,063 B2
(45) Date of Patent: Apr. 12, 2011

(54) ELECTRONIC CONTROL APPARATUS FOR CONTROLLING DRIVING OF LOAD BY MOS FETS

(75) Inventors: Toru Itabashi, Anjo (JP); Mitsuhiro Kanayama, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/926,993

(22) Filed: Aug. 27, 2004

(65) Prior Publication Data

US 2005/0046280 A1 Mar. 3, 2005

(30) Foreign Application Priority Data

Aug. 27, 2003 (JP) ................................. 2003-303326
Jun. 23, 2004 (JP) ................................. 2004-185280

(51) Int. Cl.
*H03B 1/00* (2006.01)
(52) U.S. Cl. ..................... 327/108; 327/109; 327/198
(58) Field of Classification Search .................. 327/390, 327/437, 536, 537
See application file for complete search history.

(56) References Cited

U.S. PATENT DOCUMENTS

| | | | |
|---|---|---|---|
| 4,246,635 A | 1/1981 | Arima | |
| 4,837,466 A * | 6/1989 | Kanauchi | 327/31 |
| 5,021,727 A | 6/1991 | Mashino | |
| 5,023,474 A * | 6/1991 | Wilcox | 327/109 |
| 5,041,739 A * | 8/1991 | Goto | 327/536 |
| 5,105,144 A | 4/1992 | Trump | |
| 5,408,150 A * | 4/1995 | Wilcox | 327/108 |
| 5,426,334 A * | 6/1995 | Skovmand | 327/427 |
| 5,646,571 A * | 7/1997 | Ohashi | 327/390 |
| 5,861,861 A | 1/1999 | Nolan et al. | |
| 5,866,957 A * | 2/1999 | Baba et al. | 307/113 |
| 6,075,403 A | 6/2000 | Ishikawa et al. | |
| 6,147,552 A * | 11/2000 | Sauer | 330/9 |
| 6,195,307 B1 * | 2/2001 | Umezawa et al. | 365/226 |
| 6,211,706 B1 * | 4/2001 | Choi et al. | 327/108 |
| 6,353,345 B1 * | 3/2002 | Yushan et al. | 327/112 |
| 6,388,506 B1 | 5/2002 | Voo et al. | |
| 6,472,910 B2 * | 10/2002 | Niimi | 327/108 |
| 6,625,516 B2 * | 9/2003 | Niimi et al. | 700/170 |
| 2001/0030557 A1 * | 10/2001 | Niimi | 327/108 |
| 2002/0021150 A1 * | 2/2002 | Tuchiya et al. | 327/108 |

(Continued)

FOREIGN PATENT DOCUMENTS

JP 1-185197 7/1989

(Continued)

OTHER PUBLICATIONS

European Search Report (Continued)

*Primary Examiner* — Lincoln Donovan
*Assistant Examiner* — Ryan C Jager
(74) *Attorney, Agent, or Firm* — Nixon & Vanderhye, PC

(57) ABSTRACT

An ECU has a main IC and at least one auxiliary IC, with at least the auxiliary IC driving one or more MOS FETs to control supplying of power to respective electrical loads, e.g., in a vehicle. A stepped-up voltage, higher than the circuit power source voltage, is generated within the main IC and supplied to each auxiliary IC, for driving gate electrodes of the MOS FETs. Electrical noise produced by operation of a voltage step-up circuit in the main IC is effectively suppressed by elements that are coupled only to a power source terminal of the main IC alone.

9 Claims, 6 Drawing Sheets

U.S. PATENT DOCUMENTS

| | | | |
|---|---|---|---|
| 2002/0041178 A1* | 4/2002 | Hiraki et al. | 323/272 |
| 2002/0089889 A1* | 7/2002 | Ishii et al. | 365/226 |
| 2002/0153939 A1 | 10/2002 | Hirata | |
| 2004/0064747 A1* | 4/2004 | Haider | 713/330 |

FOREIGN PATENT DOCUMENTS

| | | |
|---|---|---|
| JP | 4-241511 | 8/1992 |
| JP | 7-66700 | 3/1995 |
| JP | 9-327117 | 12/1997 |
| JP | 10-225101 | 8/1998 |
| JP | 2002-278632 | 9/2002 |
| JP | 2003-37487 | 2/2003 |

OTHER PUBLICATIONS

Notification of Reasons for Rejection issued Nov. 11, 2008 in corresponding Japanese Application No. 2004-185280 w/ an at least partial translation.

* cited by examiner

ELECTRONIC CONTROL APPARATUS FOR CONTROLLING DRIVING OF LOAD BY MOS FETS

CROSS-REFERENCE TO RELATED APPLICATIONS

This application is based on and incorporates herein by reference Japanese Patent Application No. 2003-303326 filed on Aug. 27, 2003 and 2004-185280 filed on Jun. 23, 2004.

BACKGROUND OF THE INVENTION

1. Field of Application

The present invention relates to an electronic control apparatus, and in particular to an electronic control apparatus which controls driving of an electrical load by on/off switching of a MOS FET (metal-oxide semiconductor field effect transistor), such as an N-channel MOS FET that is connected to controllably apply a power supply voltage to a load.

2. Related Art

In the prior art, it is known to provide an electronic control apparatus in a motor vehicle, for use as an engine control apparatus or transmission control apparatus, which controls operations of the vehicle engine or of the vehicle transmission by controlling relays, solenoids, etc. However in recent years, with the advances made in automatic control, there has been an increasing trend for requiring a greater amount of electrical load to be driven by such an electronic control apparatus. That is to say, due to the demand for a higher degree of accuracy and flexibility of controlling various controlled mechanisms, the amount of electrical load that must be driven has increased. In addition, there has been a broadening of the range of functions that are implemented by electronic control.

MOS FETs are primarily used as switching elements for performing switching whereby power is selectively supplied to an electrical load, due to the fact that MOS FETs can carry a higher level of current with a lower amount of heat being generated than is possible with bipolar transistors. In particular, N-channel MOS FETs are widely used, since these are less expensive than P-channel MOS FETs and generate lower amounts of heat.

In the case of electrical equipment of a motor vehicle, it is preferable that "high side" driving of switching elements is performed, i.e., whereby the switching element is located upstream with respect to an electrical load, in order to provide greater safety in the event of a short-circuit occurring whereby an electrical path is produced between the electrical load and ground potential, that is to say, 0 V potential. The descriptions given herein assume the use of a power source having one terminal connected to ground potential, and the term "located upstream" is used herein with the significance of being connected between a first terminal of an electrical load and the power source potential, with the second terminal of the electrical load being connected to ground potential.

For that reason, with an electronic control apparatus used in a motor vehicle, the electronic control apparatus controls on/off switching of an N-channel MOS FET that is connected at the upstream side of an electrical load, in series with that load. The switching is generally performed in accordance with command signals that are produced from a microcomputer. In addition, such an electronic control apparatus generally includes a voltage step-up circuit for producing a stepped-up voltage that is higher than the power supply voltage of the electronic control apparatus, with that stepped-up voltage being selectively applied through a pre-drive circuit to the gate of the N-channel MOS FET, in accordance with the command signals, to achieve the on/off switching. In the case of an electronic control apparatus used in a motor vehicle, the power supply voltage is generally that of the vehicle battery. Such types of electronic control apparatus are described for example in Japanese Patent Laid-open No. 4-241511 and Japanese Patent No. 2572408. Typically, a charge pump type of circuit is used as the voltage step-up circuit, whereby charging of a plurality of capacitors is used to achieve the stepped-up voltage. Such types of electronic control apparatus are described for example in the aforementioned Japanese Patent Laid-open No. 4-241511 and Japanese Patent No. 2572408, and also in Japanese Patent No. 3314473 and Japanese Patent No. 23368783.

Generally, in order to achieve compactness of the electronic control apparatus, the voltage step-up circuit and the pre-drive circuit are configured in an IC (integrated circuit). This may be separate from one or more N-channel MOS FETs that are driven thereby. Alternatively, the voltage step-up circuit and the pre-drive circuit may be configured together with the N-channel MOS FET, as an IC.

A configuration for an electronic control apparatus that has been previously envisaged by the assignee of the present invention will be described referring to the circuit example of FIG. 6. In the following and in the description of embodiments given hereinafter, the terminal "voltage" is to be understood as signifying a DC voltage, unless otherwise indicated. In FIG. 6, an electronic control apparatus 100 is connected to one terminal of each of five solenoids L1 to L5, which constitute the electrical load of the electronic control apparatus 100. The opposite terminal of each of the solenoids L1 to L5 is connected to ground potential (GND).

The electronic control apparatus 100 includes a microcomputer 7 which determines the respective levels of power that are supplied to drive the solenoids L1 to L5, a driver IC 101 that drives the solenoids L1, L2 in accordance with command signals S1, S2 respectively that are part of a set of command signals S1 to S5 produced from the microcomputer 7, a driver IC 102 that drives the solenoids L3, L4 in accordance with the command signals S3, S4 respectively from the microcomputer 7, and a driver IC 103 that drives the solenoid L5 in accordance with the command signal S5.

In FIG. 6, the concentric-circle symbols indicate respective terminals of the electronic control apparatus 100, and the single-circle symbols indicate terminals of the driver ICs 101 to 103. This convention is also used in other drawings that are described in the following.

The driver ICs 101 to 103 are internally provided with respective charge pump circuits 111 to 113, each of which generates a stepped-up voltage that is higher than the power supply voltage, constituted by the voltage VB of the battery 9.

In addition to the charge pump circuit 111, the driver IC 101 internally incorporates an N-channel MOS FET 1, with the source electrode connected to the opposite terminal of the solenoid L1 from the ground terminal thereof and the drain electrode connected to receive the battery voltage VB, an N-channel MOS FET 2 with the source electrode connected to the opposite terminal of the solenoid L2 from the ground terminal thereof and the drain electrode connected to receive the battery voltage VB, and two pre-drive circuits 11 and 12 which each receive the stepped-up voltage produced from the charge pump circuit 111, transferred via a diode 21 and are controlled by the command signals S1, S2 respectively from the microcomputer 7. When the command signal S1 is at the active level (assumed herein to be a high level), the pre-drive circuit 11 applies the stepped-up voltage from the charge pump circuit 111 to the gate electrode of the N-channel MOS FET 1, thereby turning the N-channel MOS FET 1 on (i.e., to produce a conducting path between drain and source), while when the command signal S1 is not at the active level, the pre-drive circuit 11 does not apply the stepped-up voltage to the gate electrode of the N-channel MOS FET 1, thereby turning the N-channel MOS FET 1 off. In the case of the pre-drive circuit 12, in the same way as for the pre-drive circuit 11, when the command signal S2 is at the active level, the pre-drive circuit 12 applies the stepped-up voltage from the charge pump circuit 111 to the gate electrode of the N-channel MOS FET 2, thereby turning the N-channel MOS FET 2 on, while when the command signal S2 is not at the active level, the pre-drive circuit 12 does not apply the stepped-up voltage to the gate electrode of the N-channel MOS FET 2, thereby turning the N-channel MOS FET 2 off.

Similarly, in addition to the charge pump circuit 112, the driver IC 102 internally incorporates an N-channel MOS FET 3, with the source electrode connected to the opposite terminal of the solenoid L3 from the ground terminal thereof and the drain electrode connected to receive the battery voltage VB, an N-channel MOS FET 4 with the source electrode connected to the opposite terminal of the solenoid L4 from the ground terminal thereof and the drain electrode connected to receive the battery voltage VB, and two pre-drive circuits 13 and 14 which each receive the stepped-up voltage produced from the charge pump circuit 112, transferred via a diode 22, and are controlled by the command signals S3, S4 from the microcomputer 7 respectively. When the command signal S3 is at the active level, the pre-drive circuit 13 applies the stepped-up voltage from the charge pump circuit 112 to the gate electrode of the N-channel MOS FET 3, thereby turning the N-channel MOS FET 3 on, while when the command signal S3 is not at the active level, the pre-drive circuit 13 does not apply the stepped-up voltage to the gate electrode of the N-channel MOS FET 3, thereby turning the N-channel MOS FET 3 off. Similarly when the command signal S4 from the microcomputer 7 is at the active level, the pre-drive circuit 14 applies the stepped-up voltage from the charge pump circuit 112 to the gate electrode of the N-channel MOS FET 4, thereby turning the N-channel MOS FET 4 on, while when the command signal S4 is not at the active level, the pre-drive circuit 14 does not apply the stepped-up voltage to the gate electrode of the N-channel MOS FET 4, thereby turning the N-channel MOS FET 4 off.

Moreover in addition to the charge pump circuit 113, the driver IC 103 internally incorporates an N-channel MOS FET 5, with the source electrode connected to the opposite terminal of the solenoid L5 from the ground terminal thereof and the drain electrode connected to receive the battery voltage VB, and a pre-drive circuit 15 which receives the stepped-up voltage produced from the charge pump circuit 113, transferred via a diode 23 and is controlled by the command signal S5 from the microcomputer 7. When that command signal is at the active level, the pre-drive circuit 15 applies the stepped-up voltage from the charge pump circuit 113 to the gate electrode of the N-channel MOS FET 5, thereby turning the N-channel MOS FET 5 on, while when the command signal S5 is not at the active level, the pre-drive circuit 15 does not apply the stepped-up voltage to the gate electrode of the N-channel MOS FET 5, thereby turning the N-channel MOS FET 5 off.

It can thus be understood that when a command signal Sn (where n is in the range 1 to 5) is produced from the microcomputer 7 at the active level, the FETn that corresponds to the command signal Sn is set in the on state, whereby current flows through the corresponding solenoid Ln.

As shown in FIG. 6, in the driver ICs 101 to 103, respective capacitors 24, 25, 26 are connected between a power supply terminal Td (to which the battery voltage VB is applied) and the ground terminal Tg of each driver IC. In addition, an inductor (i.e., coil) 27 is connected in series between the power source terminal Td of the driver IC 101 and a portion 28 of a printed circuit pattern in the electronic control apparatus 100 that transfers the battery voltage VB (that portion being referred to in the following as the common power supply lead). The capacitors 24 to 26 and the inductor 27 serve as noise suppression elements, to suppress electrical noise that is generated by the operation of the charge pump circuits 111 to 113.

The action of these noise suppression elements will be described referring to a specific example. FIG. 7A shows an example of a charge pump circuit 30, which is representative of each of the charge pump circuits 111 to 113 shown in FIG. 6, while FIG. 7B shows waveforms for describing the operation of the circuit of FIG. 7A.

The charge pump circuit 30 is made up of a discharge-operation switching element 31 formed of a PNP transistor having its emitter connected to the power source terminal Td and a charge-operation switching element 32 formed of an NPN transistor having its collector connected to the collector of the discharge-operation switching element 31 and its emitter connected to the ground terminal Tg, a diode 33 having its anode connected to the emitter of the discharge-operation switching element 31, a diode 34 having its anode connected to the cathode of the diode 33, a capacitor (charge pump capacitor) 35 for performing voltage step-up, connected between the collectors of each of the switching elements 31, 32 and the junction of the diodes 33, 34, and an output capacitor 36 which is connected between the cathode of the diode 34 and the ground terminal Tg. The charge pump circuit 30 further includes a control signal generating section 37, for alternately setting the switching elements 31, 32 periodically on and off, as illustrated in FIG. 7B. The control signal generating section 37 incorporates an RC (resistor-capacitor) type of oscillator circuit (not shown in the drawings), made up of resistors, capacitors, etc., with the oscillation period of that oscillator circuit determining the period of on/off switching of the switching elements 31 and 32.

When the charge-operation switching element 32 of the charge pump circuit 30 is set in the on (i.e., conducting) condition, then as illustrated by the double-dot chain line arrows in FIG. 7A, current flows along a path from the power source terminal Td via the diode 33 through the capacitor 35, then through the charge-operation switching element 32, to the ground terminal Tg, thereby charging the capacitor 35. When the discharge-operation switching element 31 is set on, then as illustrated by the single-dot chain line arrows in FIG. 7A, current flows along a path from the power source terminal Td through the discharge-operation switching element 31, then through the capacitor 35, then through the diode 34, and through the output capacitor 36, to the ground terminal Tg, thereby discharging the capacitor 35 and charging the output capacitor 36.

As a result of successive repetitions of these operations, the charge voltage of the capacitor 35 is added to the charge voltage of the capacitor 36, so that a stepped-up voltage appears across the output capacitor 36 and is produced as the output voltage from the charge pump circuit 30. Due to the fact that a capacitor C is connected between the power source terminal Td and the ground terminal Tg, as shown in FIG. 7B, each time a switching element 31 or 32 is switched from the off to the on condition, current flows from the capacitor C towards the power source terminal Td. This prevents a sudden increase in current flow through the common power source line 28, as illustrated in the lower diagram of FIG. 7B.

Hence, by using the capacitor C, abrupt increases in the current that flows into the power source terminal Td from the common power source line 28 are suppressed, so that current is supplied from the common power source line 28 to the charge pump circuit 30 in a comparatively gradual manner. As a result, generation of electrical noise due to variations in current and voltage of the common power source line 28 can be effectively reduced.

If the capacitor C were not connected, then variations of voltage and current due to charging and discharging of the capacitor 35 in the process of generating the stepped-up voltage would have a significant effect on the common power source line 28, which supplies the battery voltage VB. Hence, electrical noise would be generated in the wiring harness which supplies the battery voltage VB to the electronic control apparatus 100, and this noise might affect a radio or other apparatus of the vehicle. In general, such variations in current result in electrical noise that is in a relatively low frequency range, whereas the variations in voltage result in electrical noise that is in a relatively high frequency range. The circuit configuration shown in FIG. 7A is a basic circuit, having only a single-stage capacitor 35 (i.e., charge pump capacitor) that is charged and discharged, however a greater number of such capacitors may be utilized, in accordance with the required value of stepped-up voltage and the minimum value of power source voltage of the circuit. Specifically, if the circuit is operated in a no-load condition, the output voltage level is determined by the power source voltage and the number of charge pump capacitors. When the circuit supplies current to a load (e.g., gate electrodes of a number of MOS FETs), the output voltage level will be reduced from the no-load value by an amount determined by the load current and the operating frequency (charge switching frequency). The higher the operating frequency, the closer will the output voltage approach the no-load value. In the following, the maximum amount of current that can be supplied from such a charge pump circuit while maintaining a predetermined sufficiently high value of stepped-up voltage will be referred to as the drive capability.

With the electronic control apparatus 100 of FIG. 6, capacitors 24 to 26 are respectively connected between the power source terminal Td and the ground terminal Tg of the driver ICs 101 to 103, with each of these capacitors 24 to 26 corresponding to the capacitor C shown in FIG. 7A.

Furthermore with the example of FIG. 6, each of the driver ICs 101, 102 drives two solenoids, whereas the driver IC 103 drives one solenoid, so that the charge pump circuit 113 of the driver IC 103 can be designed to produce a stepped-up voltage while having a smaller drive capability than the charge pump circuits 111 and 112 of the driver ICs 101 and 102. Hence, whereas capacitors having a relatively large capacitance (for example, tantalum capacitors) would be used as the capacitors 24, 25 of the driver ICs 101 and 102, the capacitor 26 of the driver IC 103 could have a comparatively small value of capacitance, so that a smaller and less expensive device such as a ceramic capacitor could be utilized. Furthermore, assuming that the driver IC 101 switches the current through each of the solenoids L1, L2 with a fixed period, and performs control by varying the duty ratio of the switching, the charge pump circuit 111 will be designed to have a large drive capability, so that the level of current flow into the power source terminal Td will be large. Hence, in order to effectively suppress variations in current and voltage appearing on the common power source line 28, the inductor 27 is connected between the common power source line 28 and the power source terminal Td of the driver IC 101. In that way, appropriate noise suppression elements are provided for each of the driver ICs 101 to 103 respectively, in accordance with the particular utilization conditions of these driver ICs.

Thus, with the electronic control apparatus 100 described above, it is necessary to provide respective noise suppression elements for each of the driver ICs 101 to 103, due to the operation of the charge pump circuits 111 to 113 incorporated in these driver ICs. As a result, it is necessary to provide a large number of these noise suppression elements, so that the total number of circuit components becomes large and the manufacturing cost is increased.

SUMMARY OF THE INVENTION

It is an objective of the present invention to overcome the above problem, to thereby provide an electronic control apparatus that is compact and low in cost.

To achieve the above objective, the present invention provides an electronic control apparatus including a main IC and one or more auxiliary ICs, with at least each of the auxiliary ICs being configured to perform switching of one or more MOS FETs (which typically would be N-channel MOS FETs) to drive respective electrical loads, and with the main IC incorporating a circuit for generating a stepped-up voltage that is supplied to each of the auxiliary ICs for use in driving the MOS FETs. As a result, it becomes unnecessary to provide noise suppression elements coupled to each of the auxiliary ICs, i.e., it is only necessary to provide noise suppression elements for the main IC, to prevent electrical noise that is produced by operation of the voltage step-up circuit of the main IC from being emitted from power source leads. In that way, the prior art problem described above can be effectively overcome.

More specifically, with an electronic control apparatus according to the present invention, the main integrated circuit has a power source terminal that receives an externally supplied power source voltage, and a voltage step-up circuit operating on the power source voltage to produce a stepped-up voltage that is higher than the power source voltage. Each of the auxiliary ICs is coupled to receive the stepped-up voltage from the main IC, and includes one or more drive circuits (more specifically, pre-drive circuits) for selectively applying the stepped-up voltage to respective gate electrodes of one or more MOS FETs, each connected in a current flow path of a corresponding electrical load, to perform on/off switching of the MOS FETs. In general, this switching is performed at a fixed frequency, with the on/off duty ratio of the switching being varied to control the drive power supplied to the corresponding load.

If the level of electrical noise produced by operation of the charge pump circuit is such that noise suppression is necessary, then this is accomplished by externally connecting one or more noise suppression elements directly to the power source terminal of the main IC, such as an inductor connected in series between that terminal and the power source, and/or a capacitor connected between that power source terminal and the ground terminal of the main IC.

In that way it becomes unnecessary to connect respective noise suppression elements to each of the auxiliary ICs, such as the capacitors 25, 26 in the example of FIG. 6 described above. Hence, the overall size of the electronic control apparatus may be made more compact and the manufacturing cost reduced, since the number of circuit components can be reduced. Furthermore, design considerations such as the layout of the printed circuit leads on a circuit board of the electronic control apparatus can be simplified, since it is not necessary to take into account the electrical noise that is generated from each of respective voltage step-up circuits of the various ICs that perform driving of electrical loads, but only the electrical noise that is produced by the voltage step-up circuit of the main IC.

The main IC may also include one or more drive circuits for selectively applying the stepped-up voltage to respective gate electrodes of one or more MOS FETs, each connected in a current flow path of a corresponding electrical load, to perform on/off switching of these MOS FETs. In that case, the number of loads that are driven can be increased, without an increase in the number of driver ICs, or an increase in the number of components used for noise suppression.

Alternatively, or in addition, the main IC may include one or more power supply circuits (PS), each producing an operating voltage (i.e., a stabilized DC voltage). Such an electronic control apparatus generally includes control circuit means, typically constituted by a microcomputer (where the term "microcomputer" is used herein in the general sense of a programable digital microprocessor), which generates one or more command signals for controlling the respective pre-drive circuits to thereby determine the level of power applied to each electrical load. With the present invention, such control circuit means, e.g., microcomputer, can be operated from an operating voltage produced from a power supply circuit that is incorporated in the main IC as described above, or (e.g., when operating in conjunction with peripheral circuits) from respective operating voltages produced from a plurality of power supply circuit that are incorporated in the main IC. This has the advantage that any electrical noise which is generated by the power supply circuit(s) can be suppressed by the same noise suppression elements which suppress the electrical noise that is produced by generating the stepped-up voltage. This is especially important when a switching-type power supply circuit is utilized. Hence, the overall electronic control apparatus can be made more compact and can be manufactured at lower cost than would be the case if a separate power supply circuit were to be used to provide the operating voltage for the control circuit means of the electronic control apparatus. In addition, design considerations such as the layout of printed circuit wiring become simplified, since it is unnecessary to take into account the electrical noise that is generated by a power supply circuit, and in particular the electrical noise that is generated by a switching type of power supply circuit.

Such a power supply circuit incorporated within the main IC can be configured to generate a signal, referred to as a condition signal, which indicates whether or not the operating voltage produced from that power supply circuit is being produced normally. That condition signal is supplied to the voltage step-up circuit of the main IC, which is configured to halt operation (i.e., become set in an inoperative condition) when the condition signal indicates that the corresponding operating voltage is not being produced normally.

In that way it can be ensured that if the power supply circuit ceases to generate an operating voltage normally (so that, for example, command signals may no longer be supplied for controlling driving of the MOS FETs) the on/off switching operation of the MOS FETs is halted such as to ensure that unnecessary supplying of power to the electrical load(s) is avoided, and greater stability of operation is achieved. However these effects are obtained without requiring any increase in the overall number of circuit components or increase in the chip area of any IC.

The voltage step-up circuit will in general be a charge pump circuit as discussed hereinabove. A charge pump circuit has the advantage that all of the circuit components can be formed within an integrated circuit, since it is not necessary to utilize a transformer to achieve voltage step-up operation.

From another aspect, such an electronic control apparatus can be configured such that at least one circuit element that is a constituent element of a voltage step-up circuit of a driver IC, and that has an effect upon the drive capability (as defined hereinabove) of that voltage step-up circuit is connected to the main integrated circuit as an external component.

For example, a system design change may occur whereby the total number of electrical loads that must be driven is increased, and hence the number of MOS FETs which must be driven with the stepped-up voltage to perform on/off switching is accordingly increased. Thus the drive capability of the voltage step-up circuit must be increased. However with the present invention, in such a case it is only necessary to exchange one or more externally connected components of the main IC for corresponding components having an appropriate value whereby the requisite increased level of drive capability can be achieved.

It will be understood that this enables such an electronic control apparatus to be used as a multi-purpose apparatus, i.e., which can be manufactured in a standardized form but can be easily adapted for use in various different application. As a result, manufacturing costs can be further reduced, since it becomes less necessary to design and manufacture specific types of electronic control apparatus for various different applications.

In particular, when the voltage step-up circuit is a charge pump circuit, which operates by successive superimposition of charges on a plurality of capacitors, the respective values of capacitance of these capacitors determine the drive capability of the charge pump circuit, as described hereinabove. Hence with the present invention, these capacitors can constitute the aforementioned externally connected components of the main IC which affects the drive capability of the voltage step-up circuit. By connecting these capacitors as external components, the advantage is obtained that (by suitably selecting the capacitance values) the electronic control apparatus can be adapted to various different applications, while keeping the circuit configuration and chip area (i.e., land size) of each driver IC unchanged.

Alternatively, or in addition, such an electronic control apparatus can be configured such that at least one circuit element that is a constituent element of a voltage step-up circuit in a main IC and has an effect upon an operating period of the voltage step-up circuit is connected to the main integrated circuit as an external component.

For example, the voltage step-up circuit will in general include an RC oscillator circuit that oscillates with an oscillation period that is determined by respective values of a resistor and a capacitor, with an operating period of the voltage step-up circuit (e.g., repetition period of capacitor charging/discharging operations, in the case of a charge pump circuit) being determined by the oscillation period. In that case, at least one of the resistor and the capacitor is connected to the main integrated circuit, as an external component.

Furthermore in the case of a charge pump circuit, as described hereinabove, the drive capability is affected by the operating period of the circuit, i.e., the drive capability increases in accordance with shortening of that period. Hence, the same advantages as described above (whereby the capacitors that are used in the charge pump operation are connected as external components) can be achieved by connecting an external element as a component that determines the operation period of the voltage step-up circuit.

In addition, if the amount of load (i.e., number of MOS FETs) to be driven from the stepped-up voltage is decreased, then a capacitor having a correspondingly smaller value of capacitance can be connected as that external component.

Thus, manufacturing costs can be reduced, by lowering the possibility of using components that are unnecessarily large and expensive.

Furthermore, the level of electrical noise that is produced by a charge pump circuit rises in accordance with shortening of the operating period. Hence, by providing at least one externally connected component (capacitor or resistor) whose value affects that operating period, it becomes possible to select that external component to optimize the operation in accordance with specific requirements, i.e., such as to:

(a) determine the operating period to be relatively long, so that the output drive capability of the voltage step-up circuit is relatively low, but the level of generated electrical noise is made relatively small, or (b) provide a substantially short operating period, so that the output drive capability of the voltage step-up circuit is relatively high, but, conversely, the level of generated electrical noise becomes relatively high (so that the requirements for size and/or number of noise suppression elements may be increased).

In that way, the number and/or size of noise suppression elements can be optimized, so that manufacturing costs can be further reduced.

Alternatively or in addition, such an electronic control apparatus can be configured such that a constituent element of the voltage step-up circuit that determines a target value of stepped-up voltage to be produced by the circuit is connected to the main integrated circuit as an external component. In that way, it becomes possible to freely adjust the level of stepped-up voltage in accordance with particular requirements, thereby enabling the electronic control apparatus to be more readily adaptable to various different applications, while leaving the configuration and chip size of each driver IC unchanged.

Furthermore, the level of electrical noise that is produced by a voltage step-up circuit such as a charge pump circuit becomes increased in accordance with increases in the magnitude of the stepped-up voltage. With the present invention, by selecting a value for an externally connected component such as to set the target value of stepped-up voltage to be appropriate for each particular application, it becomes possible to minimize the amount of electrical noise that is produced, while enabling an electronic control apparatus having a standardized configuration to be adapted for various different applications. Furthermore by combining optimization of noise suppression in that manner with optimizing the aforementioned noise suppression elements to be appropriate for a specific application, the manufacturing costs can be further minimized, since the number and/or capacity of the noise suppression elements can be minimized.

Moreover, when such an electronic control apparatus is to be capable of use in a variety of different applications, there may be cases in which the level of electrical load that is to be driven by an auxiliary IC (or of a combination of elements that are to be driven by respective auxiliary ICs) is so large that the drive capability of the voltage step-up circuit of the main IC would be insufficient. In order to be adaptable to such a case, the invention provides an electronic control apparatus as described above, but wherein one or all of the auxiliary ICs further includes a voltage step-up circuit operating from the power source voltage, supplied to a power source terminal of that auxiliary IC, to internally produce a stepped-up voltage that is higher than the power source voltage.

In that way, each auxiliary IC can be operated independently of the main IC when necessary (i.e., by disconnecting the supply of stepped-up voltage from the main IC, and supplying the internally generated stepped-up voltage to the pre-drive circuits of that auxiliary IC).

In that case, each such auxiliary IC is preferably configured such that its internal voltage step-up circuit can be set in an inoperative condition when it is not required to be used, thereby lowering the level of power consumption and preventing generation of electrical noise when that circuit is not required to be used. With the present invention, the internal voltage step-up circuit of such an auxiliary IC can be selectively set in an operative condition and an inoperative condition in accordance with whether or not a constituent element of that internal voltage step-up circuit is connected to the auxiliary integrated circuit as an external component.

In the case of a voltage step-up circuit that is configured as a charge pump circuit, for example, one or all of the capacitors which are subjected to charging/discharging for generating the stepped-up voltage can be connected as external components of the auxiliary IC. In that case:

(a) if the electronic control apparatus is to be used in an application whereby that auxiliary IC is not required, then the capacitors can be omitted from being connected, thereby setting the voltage step-up circuit of that auxiliary IC in the inoperative condition, and moreover reducing the manufacturing cost of the electronic control apparatus, while (b) if the capacitors are required to be connected, then the values of the capacitors can be selected to be appropriate for the level of output drive capability that is required (as described hereinabove, for the case of the voltage step-up circuit of the main IC), i.e., it becomes possible to avoid the use of unnecessarily large and expensive components.

Such an auxiliary IC can be used either in conjunction with the main IC (i.e., receiving the stepped-up voltage from the main IC, with the internal voltage step-up circuit of the auxiliary IC being held inoperative, e.g., by having an external component omitted, as described above), or independently of the main IC (i.e., with the stepped-up voltage from the main IC being disconnected, and the internally generated stepped-up voltage of the auxiliary IC being utilized). Thus, the electronic control apparatus becomes more widely applicable to a variety of different application, where various different levels of load and numbers of loads must be driven.

Alternatively, or in addition, such an auxiliary IC can be provided with a control input terminal, and the voltage step-up circuit of that auxiliary IC can be configured such as to be coupled to that control input terminal and to be set in the inoperative condition when a predetermined signal is applied to that input terminal. For example, the voltage step-up circuit may be configured such as to be rendered inoperative when the control input terminal is connected to ground potential.

In the prior art in general, an electronic control apparatus is provided with noise suppression elements that are located close to the power source terminal of the apparatus. With the electronic control apparatus example of FIG. 6, if the inductor 27 were to be removed, and a filter formed of an inductor, capacitor, etc., were to be connected in the common power supply lead 28 at a position between the power source terminal of the electronic control apparatus 100 (indicated by the double-circle symbol) and the point at which the common power supply lead 28 becomes branched into two leads which are respectively connected to the power source terminal Td of the charge pump circuit 111 and to the drain electrodes of the N-channel MOS FETs 1 to 5, then this would prevent electrical noise that results from operation of the charge pump circuit 111 (i.e., due to variations in current and voltage caused by generating the stepped-up voltage) from being emitted by external power supply leads that are connected to the power source terminal of the electronic control apparatus 100 for supplying the battery voltage VB, i.e., such as an external wiring harness.

However if such a method were to be used, then the electrical noise that results from operation of the charge pump circuit 111 will be radiated from external connecting leads (i.e., external to the electronic control apparatus) between the N-channel MOS FETs and their loads. With the example of FIG. 6, such noise would be radiated from the respective external connecting leads between the source electrodes of the N-channel MOS FETs 1 to 5 and the solenoids L1 to L5.

Moreover, in the case of an electronic control apparatus that is installed in a motor vehicle, with the vehicle battery being used to provide the power source voltage, it is necessary to ensure that the stepped-up voltage remains at a sufficiently high level for periodically driving each N-channel MOS FET to a substantially completely "on" condition, i.e., whereby a low-resistance path is produced between the FET drain and source electrodes. In particular, it is necessary to ensure that the stepped-up voltage will have a sufficiently high level even when the power source voltage (battery voltage) has fallen substantially, due to operating under a heavy load, or due to operating in a very cold environment. This will result in a corresponding lowering of the stepped-up voltage. Moreover, with a charge pump circuit used as the voltage step-up circuit, when the power source voltage becomes low, the effects of various voltage drops that occur across elements within the circuit will further cause a lowering of the stepped-up voltage that is produced. For example, such voltage drops occur as the collector-emitter saturation voltage of a bipolar transistor used as a switching element (e.g., transistor 32 in FIG. 7), the forward voltage drop across a diode (e.g., across each of the diodes 33, 34 in FIG. 7), etc.

When a charge pump circuit is used, then (assuming that the number of capacitors used in the stepped-up voltage generation operation is fixed, and that the capacitance of each capacitor is fixed) in order to increase the level of stepped-up voltage towards the maximum value (i.e., no-load value) when supplying a load, it is necessary to decrease the operating period of the circuit (e.g., thereby increasing the frequency of repetitive charging of the output capacitor 36 in the example of FIG. 7).

Moreover, when such an electronic control apparatus is installed in a motor vehicle, for such applications as engine control or transmission control, it is preferable that the lengths of the connecting leads between the controlled devices and the electronic control apparatus be made as short as possible. As a result, the electronic control apparatus will generally be mounted in a location that is subjected to heat produced by the engine, or by the transmission. In such conditions, when the loads are driven by periodic switching using N-channel MOS FETs, it is desirable to decrease the "on" state (drain-source) resistance of each N-channel MOS FET, in order to minimize the amount of heat generated by the switching operation, and so lower the operating temperature of the N-channel MOS FETs as far as possible. To do so, it is necessary to increase the level of the stepped-up voltage that is applied to the gate electrodes of the N-channel MOS FETs.

It can thus be understood that in the case of an electronic control apparatus that is used in a motor vehicle, it is essential to ensure that the stepped-up voltage generated by a charge pump circuit has a sufficiently high value, even when the power source voltage reaches a low level. In order to achieve this without using an excessive number and size of the capacitors used to perform stepped-up voltage generation, it is necessary to use a substantially high operating frequency for the charge pump circuit, with that frequency typically being approximately 5 kHz. When fixed-frequency switching with duty ratio control is used for controlling driving of electrical loads such as solenoids, the switching frequency is typically 500 Hz, i.e., the operating frequency of the charge pump circuit is generally approximately 10 times the drive frequency of the electrical loads.

If the operating frequency of the charge pump circuit were to be approximately the same as the drive frequency of the electrical loads, e.g., 500 Hz, then the frequency of the noise produced by operation of the charge pump circuit and the noise produced by driving the N-channel MOS FETs would be within approximately the same frequency range, and would not present a serious problem.

However for the various reasons described above, in the case of an electronic control apparatus used in a motor vehicle, it is necessary to use a substantially high operation frequency for a charge pump circuit used as a voltage step-up circuit, with that frequency being substantially higher than the drive frequency applied to the loads. In such a case, it is essential to not only prevent the electrical noise produced by the charge pump circuit from being radiated by external power supply leads of the electronic control apparatus, but also to prevent that electrical noise from being radiated by the connecting leads (including leads that are external to the electronic control apparatus) which connect the N-channel MOS FETs to the respective electrical loads.

For that reason, with the present invention, an electronic control apparatus has a power supply path (i.e., extending from a power source terminal of the electronic control apparatus) that is formed with at least two branches, consisting of a first power supply path which is connected to a power source terminal of the main IC, and a second power supply path which is connected to the drain electrodes of the N-channel MOS FETs and hence to the respective electrical loads, with noise suppression elements being connected to the first power supply path.

In that way, these noise suppression elements can effectively prevent the electrical noise produced by operation of the voltage step-up circuit (charge pump circuit) within the main IC from being radiated by the external power supply leads of the electronic control apparatus, while also preventing that electrical noise from being radiated by external connecting leads between the N-channel MOS FETs and the respective electrical loads.

BRIEF DESCRIPTION OF THE DRAWINGS

FIG. 7A is a circuit diagram for describing the operation of a charge pump circuit used with the first, second or third embodiments and a noise suppression element connected to that circuit, while

DESCRIPTION OF PREFERRED EMBODIMENTS

Figure 1:
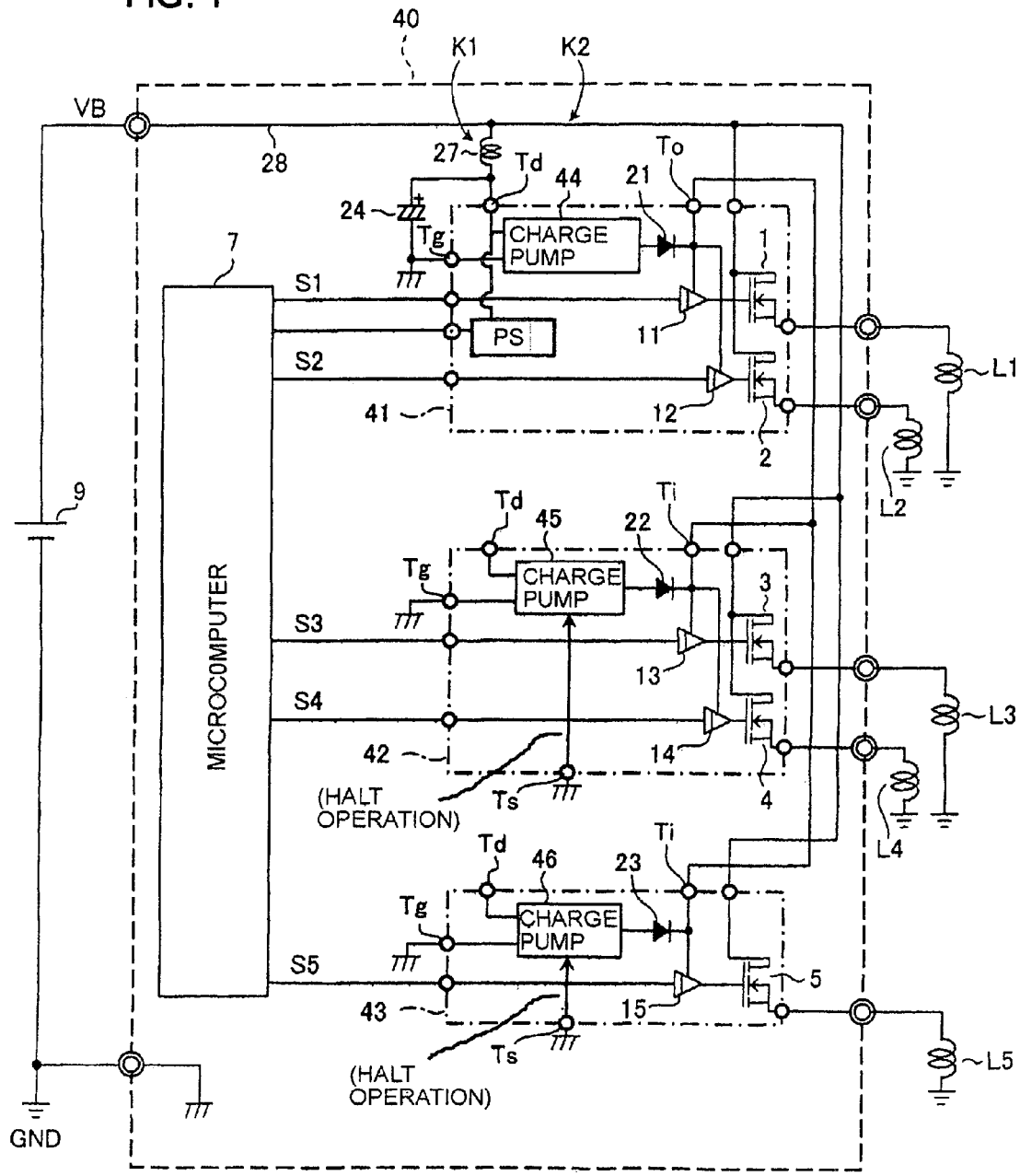
FIG. 1 is a circuit diagram of a first embodiment of an electronic control apparatus.
Figure 2:
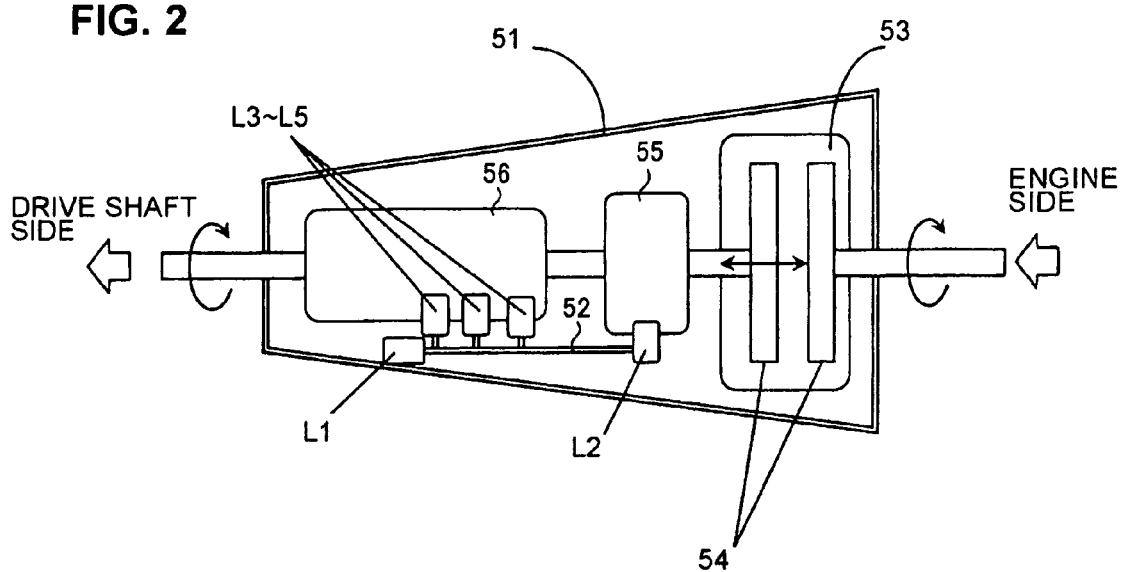
FIG. 2 is a cross-sectional view illustrating a vehicle transmission that is controlled by solenoids which are driven by the electronic control apparatus of the first embodiment.

Embodiments of an electronic control apparatus (i.e., electronic control unit, referred to in the following description as an ECU) according to the present invention will be described in the following. FIG. 1 shows the configuration of a first embodiment of an ECU, designated by numeral 40. In the same way as for the ECU 100 of the example of FIG. 6 described above, the ECU 40 drives five solenoids L1 to L5, as an electrical load. FIG. 2 is a cross-sectional view of a vehicle transmission 51, which illustrates how these solenoids may be utilized in controlling the transmission. Specifically, the solenoid L1 is a main oil pressure solenoid, for adjustment of the oil pressure in a main oil pressure path 52 in the transmission 51. The solenoid L2 is a lock-up solenoid that supplies oil from the main oil pressure path to a lock-up drive section 55 of the transmission 51, which is linked by oil pressure to a clutch 54 provided in a torque converter 53 of the transmission 51, and which performs a lock-up function. The solenoids L3 to L5 are respective shift solenoids that supply oil from the main oil pressure path 52 to a gear section 56 of the transmission 51, for changing the gear reduction ratio of the gear section 56. Thus, the ECU 40 serves as an apparatus for controlling the transmission 51 of the vehicle.

Figure 6:
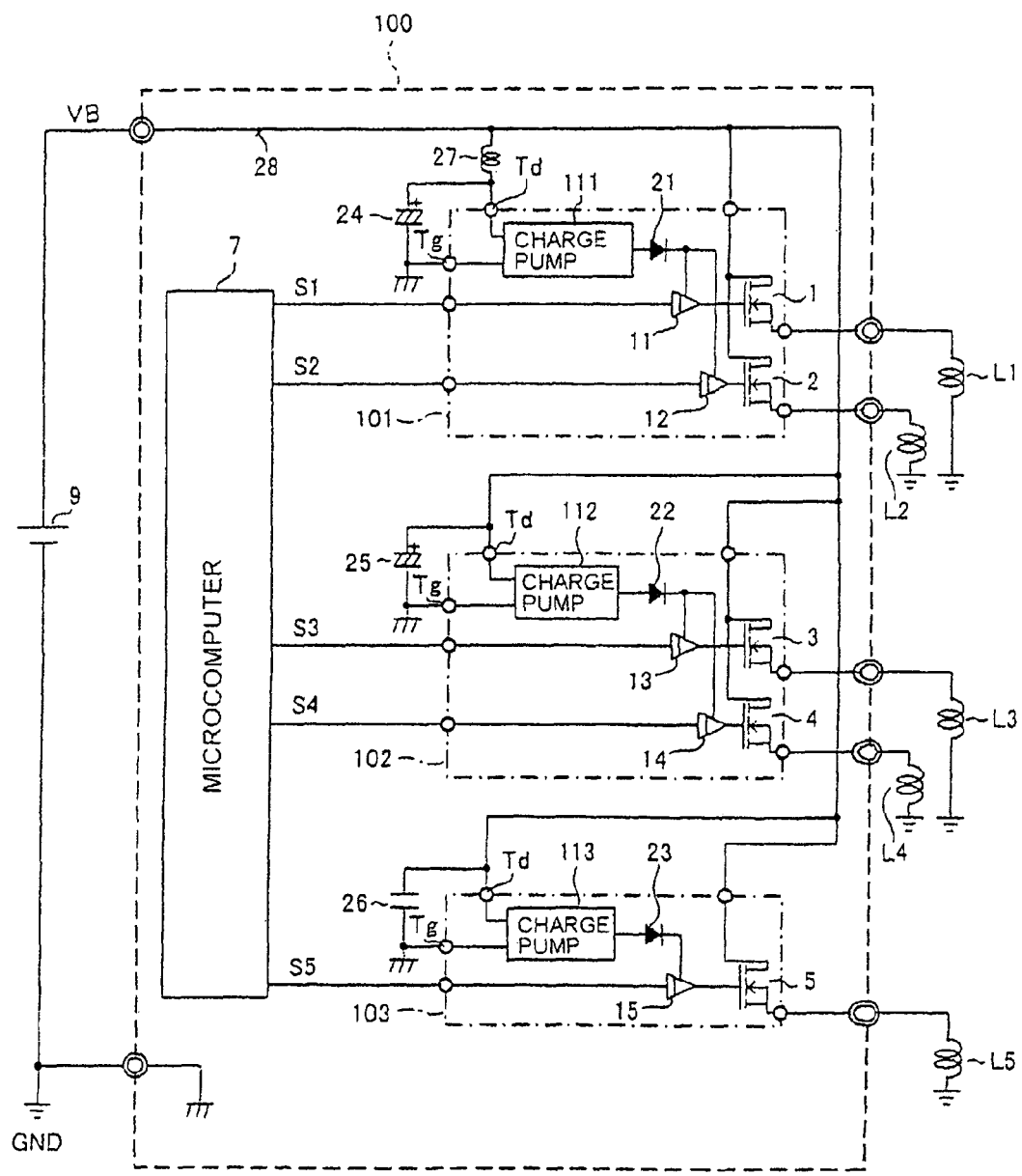
FIG. 6 is a circuit diagram of an example of an electronic control apparatus that has been envisaged previously by the assignee of the present invention.

In FIG. 1, element, signals and voltages having identical functions to those of FIG. 6 are indicated by identical reference designations to those of FIG. 6, and detailed description of these will be omitted.

With this embodiment as shown in FIG. 1, only the inductor 27 and the capacitor 24 are provided as noise suppression elements, connected to the power source terminal Td of a driver IC 41. In addition, there are the following points of difference (1-1) to (1-5) between the ECU 40 of this embodiment and the ECU 100 of FIG. 6 described above:

(1-1) Firstly, driver ICs 41, 42, 43 are used in place of the driver ICs 101, 102, 103 of the ECU 100, respectively. The driver ICs 41, 42, and 43 incorporate respective internal charge pump circuits 44, 45, 46.

(1-2) By comparison with the ECU 100 of FIG. 6, the driver IC 41 is provided with a stepped-up voltage output terminal To, for outputting to the exterior a stepped-up voltage that is generated by the charge pump circuit 44. In the same way as for the charge pump circuit 111 of the driver IC 101, the charge pump circuit 44 receives the battery voltage VB at a power source terminal Td, and generates a stepped-up voltage that is higher than VB. However the drive capability of the charge pump circuit 44 is predetermined such as to be capable of at least driving all of the solenoids L1 to L5 concurrently (more specifically, to be capable of at least producing a sufficient level of output current to concurrently supply the stepped-up voltage to all of the pre-drive circuits 11 to 15 that are coupled to respective gate electrodes of the N-channel MOS FETs 1 to 5 that drive the solenoids L1 to L5 respectively). The driver IC 41 thus can be considered as a main IC, and the remaining driver integrated circuits 42 and 43 of this embodiment can be regarded as auxiliary ICs.

(1-3) The driver IC 42 differs from the driver IC 102 of FIG. 6 with respect to the following points (1-3-a) to (1-3-c):

(1-3-a) In addition to having the charge pump circuit 45 incorporated internally in place of the charge pump circuit 112 of the driver IC 102, the driver IC 42 is provided with a separate voltage input terminal Ti, for inputting an externally supplied stepped-up voltage that is higher than the battery voltage VB.

(1-3-b) The stepped-up voltage input terminal Ti is connected to the cathode of a diode 22 that is provided within the driver IC 42, with the cathode of the diode 22 being coupled to receive the stepped-up voltage that is produced from the charge pump circuit 45. Hence, either the stepped-up voltage that is inputted to the stepped-up voltage input terminal Ti or the stepped-up voltage that is generated internally by the charge pump circuit 45 can be supplied to each of the pre-drive circuits 13 and 14, since a wired-OR connection to each of the pre-drive circuits 13, 14 exists between the stepped-up voltage that is inputted to the stepped-up voltage input terminal Ti and the stepped-up voltage that is generated internally by the charge pump circuit 45. The stepped-up voltage that is supplied to the pre-drive circuits 13, 14 is thereby switched periodically in accordance with the command signals S3, S4 from the microcomputer 7, and the resultant switched stepped-up voltages are supplied from the pre-drive circuits 13, 14 to the gate electrodes of the N-channel MOS FETs 3 and 4 respectively.

(1-3-c) The driver IC 42 is further provided with a selector terminal Ts, for enabling the charge pump circuit 45 to be selectively set in the operative and inoperative conditions. Specifically (when the battery voltage VB is being supplied to the power source terminal Td of the driver IC) a high potential (e.g., 5 V) is supplied internally in the driver IC 42 to the selector terminal Ts such that when the selector terminal Ts is left unconnected to the exterior, it is "pulled up" to that high potential, with the operation of the charge pump circuit being thereby enabled. The charge pump circuit 45 is configured internally such that when the selector terminal Ts is connected externally to ground potential (to be "pulled down") this has the effect of inputting an "operation halt" command signal to the charge pump circuit 45. Hence, the charge pump circuit 45 is made inoperative. even if the battery voltage VB is being supplied to the power source terminal Td.

It should be noted that it would be equally possible to configure the charge pump circuit 45 such as to be rendered inoperative when some predetermined potential other than ground potential, or some predetermined signal that is produced within the ECU 40 or externally thereto, is inputted to the selector terminal Ts.

(1-4) The driver IC 43 differs from the driver IC 103 of FIG. 6 with respect to the following points (1-4-a) to (1-4-c):

(1-4-a) In addition to having the charge pump circuit 46 incorporated internally in place of the charge pump circuit 113 of the driver IC 103, the driver IC 43 is provided with a separate voltage input terminal Ti, for inputting an externally supplied stepped-up voltage that is higher than the battery voltage VB.

(1-4-b) The stepped-up voltage input terminal Ti is connected to the cathode of a diode 23 provided within the driver IC 43, whose anode receives the stepped-up voltage produced from the charge pump circuit 46. Hence, either the stepped-up voltage that is inputted to the stepped-up voltage input terminal Ti or the stepped-up voltage that is generated internally by the charge pump circuit 46 can be supplied to the pre-drive circuit 15, since a wired-OR connection to the pre-drive circuit 15 exists between the stepped-up voltage that is inputted to the stepped-up voltage input terminal Ti and the stepped-up voltage that is generated internally by the charge pump circuit 46. The stepped-up voltage that is supplied to the pre-drive circuit 15 is thereby switched on and off in accordance with the command signal S5 from the microcomputer 7, and the resultant switched stepped-up voltage is supplied from the pre-drive circuit 15 to the gate electrode of the N-channel MOS FET 5.

(1-4-c) The driver IC 43 is further provided with a selector terminal Ts, for enabling the charge pump circuit 46 to be selectively set in the operative and inoperative conditions in the same way as described for the driver IC 42, i.e., such that when the selector terminal Ts is connected externally to ground potential this has the effect of inputting a control signal to the charge pump circuit 46 whereby the operation of the charge pump circuit 46 is halted, even if the battery voltage VB is being supplied to the power source terminal Td of the driver IC 43.

Hence, the differences between the driver IC 103 and the driver IC 43 correspond to the differences between the driver IC 102 and the driver IC 42.

(1-5) The stepped-up voltage from the charge pump circuit 44 of the driver IC 41 is applied from the terminal To of the driver IC 41 to the stepped-up voltage input terminal Ti of each of the driver ICs 42 and 43.

In FIG. 1, in which it is assumed that the charge pump circuits 45, 46 of the driver ICs 42, 43 are not to be utilized, no external connection is shown to the power source terminal Td of each of the driver ICs 42 and 43. However even if the battery voltage VB is fixedly applied to each of these terminals Td (e.g., with these terminals being connected in common to the power source terminal Td of the driver IC 41) both of the charge pump circuits 45, 46 are held in an inoperative condition, due to the fact that the ground terminal Tg of each of these ICs is connected to ground potential.

Figure 7A:
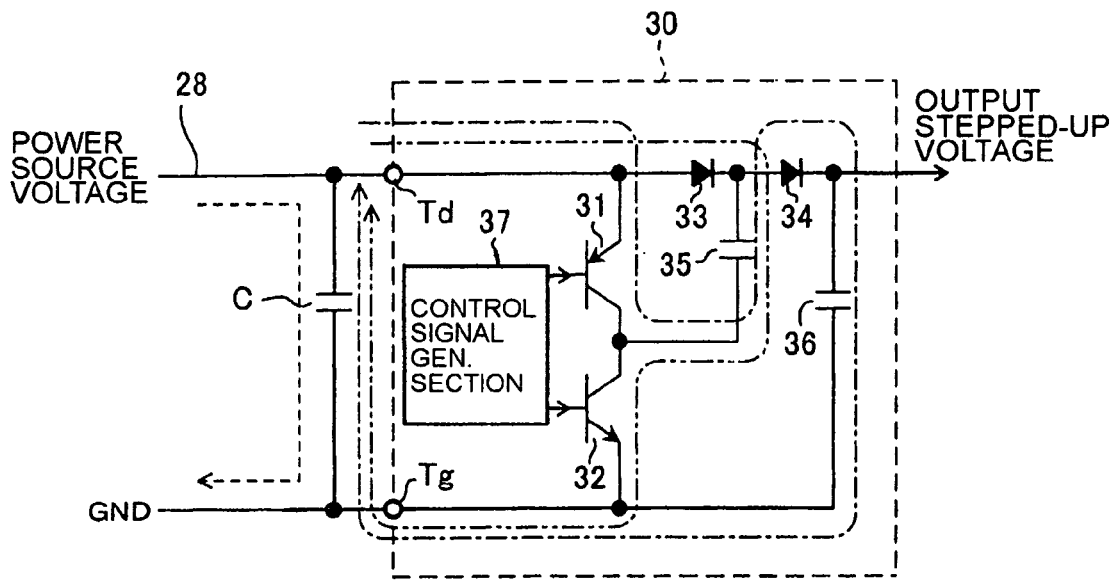
Figure 7B:
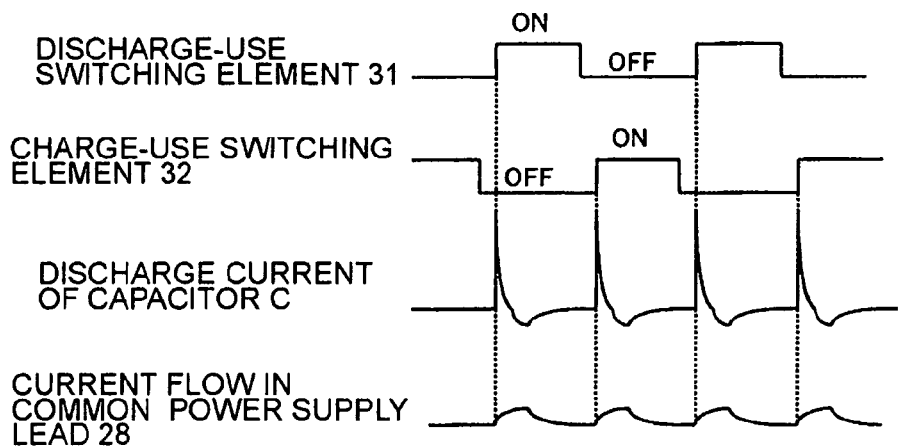
FIG. 7B shows operating waveforms of the circuit of FIG. 7A.

Various configurations could be used for the charge pump circuits 44, 45, 46, including that of FIG. 7, or any of those that are described in the cited prior art reference documents. With the first embodiment of FIG. 1, when the selector terminal Ts of a driver IC is connected to ground potential, a transistor (not shown in the drawings) of the driver IC which charges a capacitor (not shown in the drawings), as is performed by the transistor 32 with respect to the capacitor 35 in the example of FIG. 7, is held fixed in the off state. At the same time a control section (not shown in the drawings) corresponding to the control signal generating section 37 in the example of FIG. 7, formed of an oscillator circuit, logic circuits etc., which performs on/off switching of the aforementioned transistor, is held in an inoperative condition. As a result, the power consumption of each of the charge pump circuits 45, 46 is reduced and the stepped-up voltage generation operation of these circuits is halted.

As can be understood from the above, with the ECU 40 of this first embodiment, the stepped-up voltage produced by the charge pump circuit 44 in the driver IC 41 is not only utilized by the driver IC 41 but is also supplied to the driver ICs 42, 43, which use this stepped-up voltage to perform on/off switching of the N-channel MOS FETs 3, 4 and 5.

Hence, of the plurality of driver ICs 41, 42, 43 that are used to drive solenoids, only the charge pump circuit 44 of the driver IC 41 is provided with noise suppression elements that are connected to the power source terminal Td (i.e., the capacitor 24 connected between the power source terminal Td and ground terminal Tg of the driver IC 41, and the inductor 27 connected between the power source terminal Td and the common power source line 28). However a sufficient noise suppression effect is achieved, with a reduction in the number of components that are used as noise suppression elements (where the term "noise suppression elements" can signify individual components or respective filter circuits). That is to say, with this first embodiment, when the driver ICs 42, 43 are utilizing the stepped-up voltage that is produced from the driver IC 41, it is only necessary to provide noise suppression elements that are coupled to the power source terminal Td of the charge pump circuit 44 in the driver IC 41 in order to suppress sudden changes in current flow in the common power source line 28 due to transitions that occur when generating the stepped-up voltage that is utilized by each of the driver ICs 41, 42, and 43, without it being necessary to provide separate noise reduction elements for the other driver ICs 42 and 43. Hence, greater compactness and lower manufacturing cost can be achieved.

Moreover as described above, the driver ICs 42 and 43 incorporate charge pump circuits 45 and 46 respectively, which (when the electronic control apparatus 40 is configured to apply the battery voltage VB to the corresponding Td terminal) each can be selectively set in an operative and an inoperative condition in accordance with whether or not the selector terminal Ts of that charge pump circuit is connected to ground potential, i.e., in accordance with whether or not a low level (0 V) signal is being inputted to that selector terminal Ts. When the charge pump circuit 45 or 46 of a driver IC 42 or 43 is in the operative condition (with the corresponding stepped-up voltage input terminal Ti in the open-circuit condition), the stepped-up voltage that is generated from that charge pump circuit drives the corresponding N-channel MOS FETs 3, 4 or N-channel MOS FET 5, via the corresponding pre-drive circuits.

Hence, by setting the selector terminal Ts of a driver IC 42 or 43 in the open-circuit condition so that the corresponding charge pump circuit is in the operative condition as described above, that driver IC can be utilized without the stepped-up voltage from the driver IC 41 being applied to the corresponding stepped-up voltage input terminal Ti. In that case, that driver IC 42 or 43 can be used independently of the driver IC 41. Thus, the driver ICs 42 and 43 are suitable for incorporation in an ECU which is readily adaptable to various types of application. As a result of this generality of use, the cost of each of the driver ICs 42 and 43 can be reduced, and hence the ECU 40 can be manufactured at lower cost.

Moreover as shown in FIG. 1, in the ECU 40 of the first embodiment, the circuit path of the battery voltage VB has at least two branches, i.e., first power supply path designated as K1 that is connected to the power source terminal Td of the driver IC 41, for supplying the charge pump circuit 44, and a second power supply path designated as K2 that constitutes a current supply path for the solenoids L1 to L5 which are connected to the drain electrodes of the N-channel MOS FETs 1 to 5 respectively, with the inductor 27 being connected in the first power supply path K1 as a noise suppression element.

As a result, the inductor 27 effectively suppresses electrical noise (resulting from the operation of the charge pump circuit 44) from being emitted from external power supply leads which transfer the battery voltage VB to the ECU 40, and also prevents such noise from being emitted from external circuit leads that are connected between the internal N-channel MOS FETs 1 to 5 and the solenoids L1 to L5 respectively.

As described hereinabove, in order to ensure stable operation under a condition whereby the battery voltage VB reaches a low level or when operating in a high ambient temperature, the operating frequency of the charge pump circuit 44 is preferably made 10 times or more higher than the drive frequency of the solenoids L1, L2 (i.e., the switching frequency of the N-channel MOS FETs 1 and 2). For example, the operation frequency of the charge pump circuit 44 may be set as 5 kHz. Hence, the electrical noise that results from operation of the charge pump circuit 44 will be emitted not only from external power supply leads but also from each of the connecting leads between the N-channel MOS FETs 1 to 5 and the solenoids L1 to L5 respectively. Thus, it is essential to effectively suppress such noise, and with the first embodiment, this is achieved by using only a single inductor 27 in conjunction with a single capacitor 24.

Figure 3:
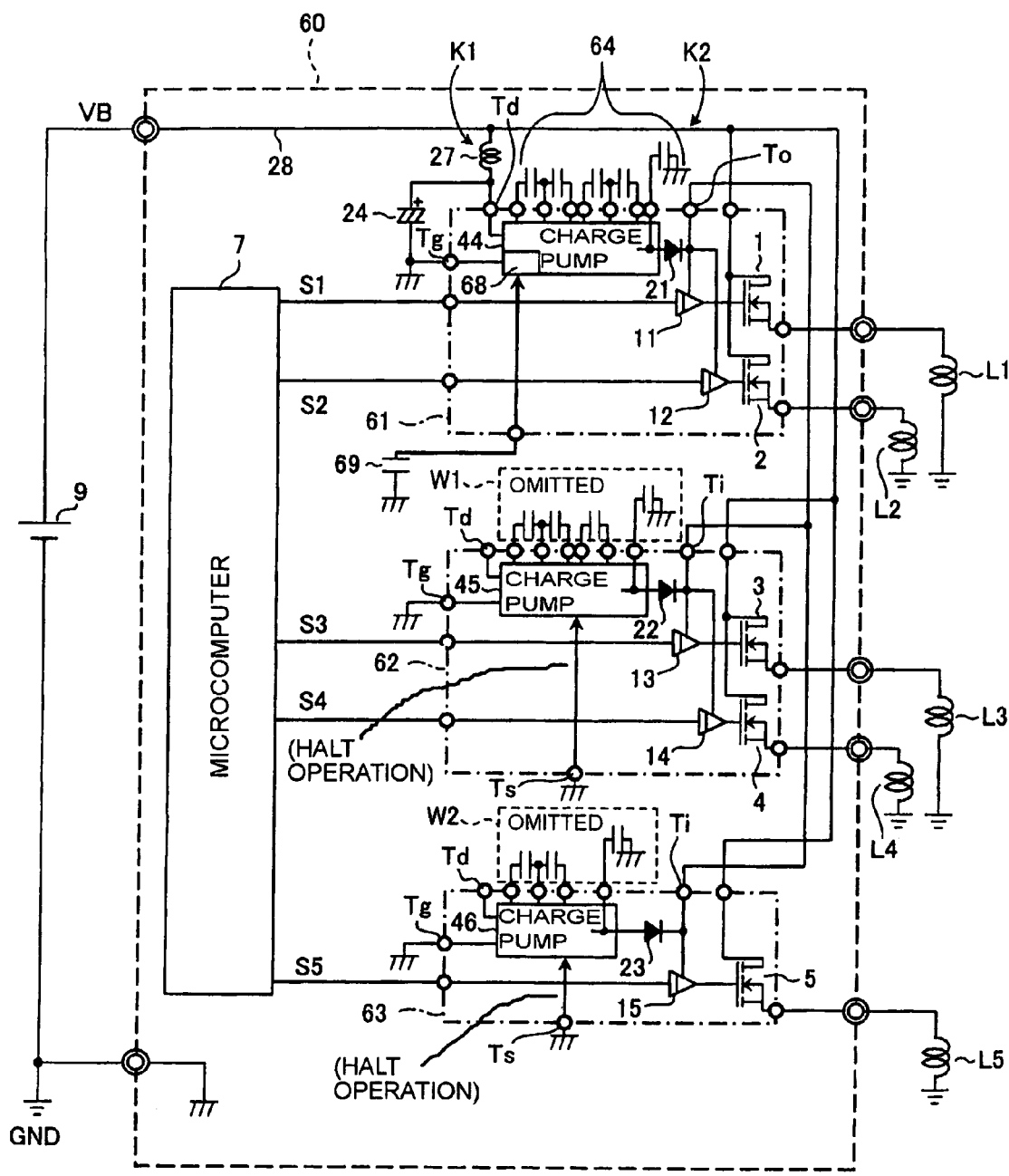
FIG. 3 is a circuit diagram of a second embodiment of an electronic control apparatus.

A second embodiment of an ECU will be described referring to FIG. 3. In FIG. 3, elements, signals and voltages having identical functions to those of FIG. 1 are indicated by identical reference designations to those of FIG. 1, and detailed description of these will be omitted.

As shown in FIG. 3, the ECU 60 of the second embodiment differs from the ECU 40 of the first embodiment with respect to the following points (2-1) to (2-4).

(2-1) Firstly, in place of the driver ICs 41, 42, 43 of the first embodiment, the second embodiment is provided with driver ICs 61, 62, 63.

(2-2) The driver IC 61 differs from the driver IC 41 of the first embodiment shown in FIG. 1 with respect to the following points (2-2-a) and (2-2-b):

(2-2-a) In the charge pump circuit 44, the circuit elements which have the greatest effect on the drive capability (as defined hereinabove) of the stepped-up voltage produced from the charge pump circuit 44 are the step-up capacitor(s) (corresponding to the capacitor 35 in the example of FIG. 7A) which is charged in order to achieve the stepped-up voltage, and the output capacitor (corresponding to the capacitor 36 in the example of FIG. 7A) which has one terminal connected to ground potential and from which the stepped-up voltage is outputted. With the second embodiment, these capacitors are provided externally, i.e., connected to the driver IC 61 from the exterior. Hence, the drive capability of the charge pump circuit 44 can be arbitrarily adjusted by appropriately selecting the capacitance values of these capacitors. In FIG. 3, these external capacitors are collectively designated by the numeral 64, and that designation will be used in the following description.

(2-2-b) Of the elements constituting the charge pump circuit 44, a capacitor and a resistor that determine the operating frequency (i.e., which determine the period of repetitive capacitor charge/discharge operations) of the charge pump circuit 44 are components of an oscillator circuit that is indicated as the block 68 within the charge pump circuit 44 in FIG. 3. With this second embodiment, the operating frequency-determining capacitor of this oscillator circuit 68 is connected as an external capacitor 69, i.e., connected externally to the driver IC 61. Thus by altering the value of this capacitor 69, the operating frequency of the charge pump circuit 44 can be arbitrarily changed.

(2-3) Furthermore, by comparison with the driver IC 42 of the first embodiment, the driver IC 62 does not include internal capacitors as the circuit elements which determine the drive capability of the charge pump circuit 45, i.e., the charge pump capacitor(s) and the output capacitor are not provided internally. Instead, if the driver IC 62 is to be set in an operative condition, these capacitors can be connected as external components, in the same manner as for the capacitors 64 of the driver IC 61, while otherwise these external capacitors are omitted. It is assumed in this description that these external capacitors of the driver IC 62 are not provided, as indicated by the broken-line frame which surround these and the designation "omitted".

(2-4) Similarly with the driver IC 63, by comparison with the driver IC 43 of FIG. 1, these capacitors which determine the drive capability of the charge pump circuit 46 are not provided internally, but can be connected externally to the driver IC 63, if the charge pump circuit 46 is to be made operative, while if the charge pump circuit 46 is to be left in the operative condition, these capacitors are omitted, as indicated.

With the ECU 60 of the second embodiment, in addition to the effects obtained by the first embodiment, the following advantages (a) to (d) are obtained.

(a) If the number and/or type of the N-channel MOS FETs that must be driven from the charge pump circuit 44 within the driver IC 61 is changed, so that the requisite stepped-up voltage drive capability is changed, then a suitable drive capability can be established by exchanging the capacitors 64 that are connected externally to the driver IC 61 for a new set of capacitors 64 that have appropriate capacitance values.

For example if it becomes necessary to supply a higher level of current with the stepped-up voltage, then this can be achieved by connecting a set of capacitors 64 having appropriately greater values of capacitance. Conversely if the amount of current that must be supplied with the stepped-up voltage becomes relatively small, for example due to a reduction in the number of solenoids that must be driven, then a set of capacitors having appropriately smaller values of capacitance can be used as the capacitors 64, thereby reducing the cost of the components.

As an example of a case in which the number of solenoids would be reduced, if the transmission 51 of FIG. 2 were to be changed from a 5-speed to a 4-speed transmission, then the solenoid L5 would no longer be required and so would be omitted. In that case, the corresponding driver IC 63 would be no longer required.

(b) Furthermore, since the drive capability of the charge pump circuit 44 of the driver IC 61 can be arbitrarily altered, the driver IC 61 is suitable for incorporation in a multi-purpose type of ECU, so that manufacturing costs can be further reduced.

(c) If one or both of the driver ICs 62, 63 is not required to use the corresponding charge pump circuit (45 and/or 46), i.e., that charge pump circuit is left in the inoperative condition, then it becomes unnecessary to connect the aforementioned external capacitors (i.e., constituting the charge pump capacitor(s) and output capacitor as described above) to such a driver IC. Hence in such a case the number of components can be reduced and the manufacturing costs thereby lowered, by comparison with an ECU such as that of FIG. 1 in which these capacitors are formed internally within each of the driver ICs.

With the driver ICs 62, 63, even if the corresponding selector terminal Ts is not connected to ground potential, the charge pump circuit of that driver IC can be selectively set in the operative or inoperative condition in accordance with whether or not the aforementioned external capacitors are connected to the driver IC. The latter method can also be used with the ECU 40 of the first embodiment. However if the selector terminal Ts of a driver IC 62 or 63 is connected to ground potential, then it is ensured that a transistor which performs charging and discharging operations within the corresponding charge pump circuit 45 or 46 is fixedly held in the off state, and the oscillation circuit and logic circuits which control on/off switching of that transistor are held in the inoperative condition, so that power consumption of the charge pump circuit is significantly reduced.

With the driver ICs 62, 63 of the second embodiment, due to the fact that the charge pump circuits 45, 46 can be made operative by connecting external capacitors as described above, these driver ICs can be used mutually independently, in the same way as described for the driver ICs 42, 43 of the first embodiment. This further contributes to enabling the ECU 60 to be used as a multi-purpose ECU, so that manufacturing costs can be further reduced.

The drive capability of the charge pump circuit 44 of the driver IC 61 can also be arbitrarily changed by selecting the value of capacitance of the capacitor 69 that is externally connected to the driver IC 61. That is to say, the smaller the value of that capacitance, the shorter will be the operating period of the charge pump circuit 44 (i.e., the oscillation period of the oscillator circuit 68), and so the greater will be the drive capability of the stepped-up voltage. That is to say, that voltage will be brought closer to the maximum value, that would be attained when no output current is supplied. By using this adjustment in conjunction with adjustment of the capacitance values of the capacitors 64, the drive capability of the stepped-up voltage can be more precisely determined.

Furthermore when only a relatively small level of drive capability is required for the stepped-up voltage produced from the charge pump circuit 44 of the driver IC 61, the capacitance of the capacitor 69 can be selected such as to provide a substantially low operating frequency of the charge pump circuit 44 (i.e., which is sufficient to provide the requisite drive capability). If that is done, then the time constant that is determined by the inductance value of the inductor 27 and the capacitance value of the capacitor 24 (i.e., the noise suppression elements) can be made relatively small, so that these may be implemented as more inexpensive components, of smaller size. In some cases, it may even be possible to omit these noise suppression elements. Hence, a more compact size and lower manufacturing cost can be achieved for the ECU.

In addition, due to the fact that the level of current that is consumed by the circuit in producing the stepped-up voltage (and the amount of heat that is accordingly generated) can be reduced, the arrangements provided for dissipation of heat can be simplified, and this further contributes to enabling the manufacturing cost to be reduced.

It should be noted that it would be equally possible to provide the aforementioned operating frequency-determining resistor of the oscillator circuit 68 as an externally connected component, instead of the capacitor 69, or to provide both the operating frequency-determining resistor and capacitor of the oscillator circuit 68 as components that are connected externally to the driver IC 61.

Figure 4:
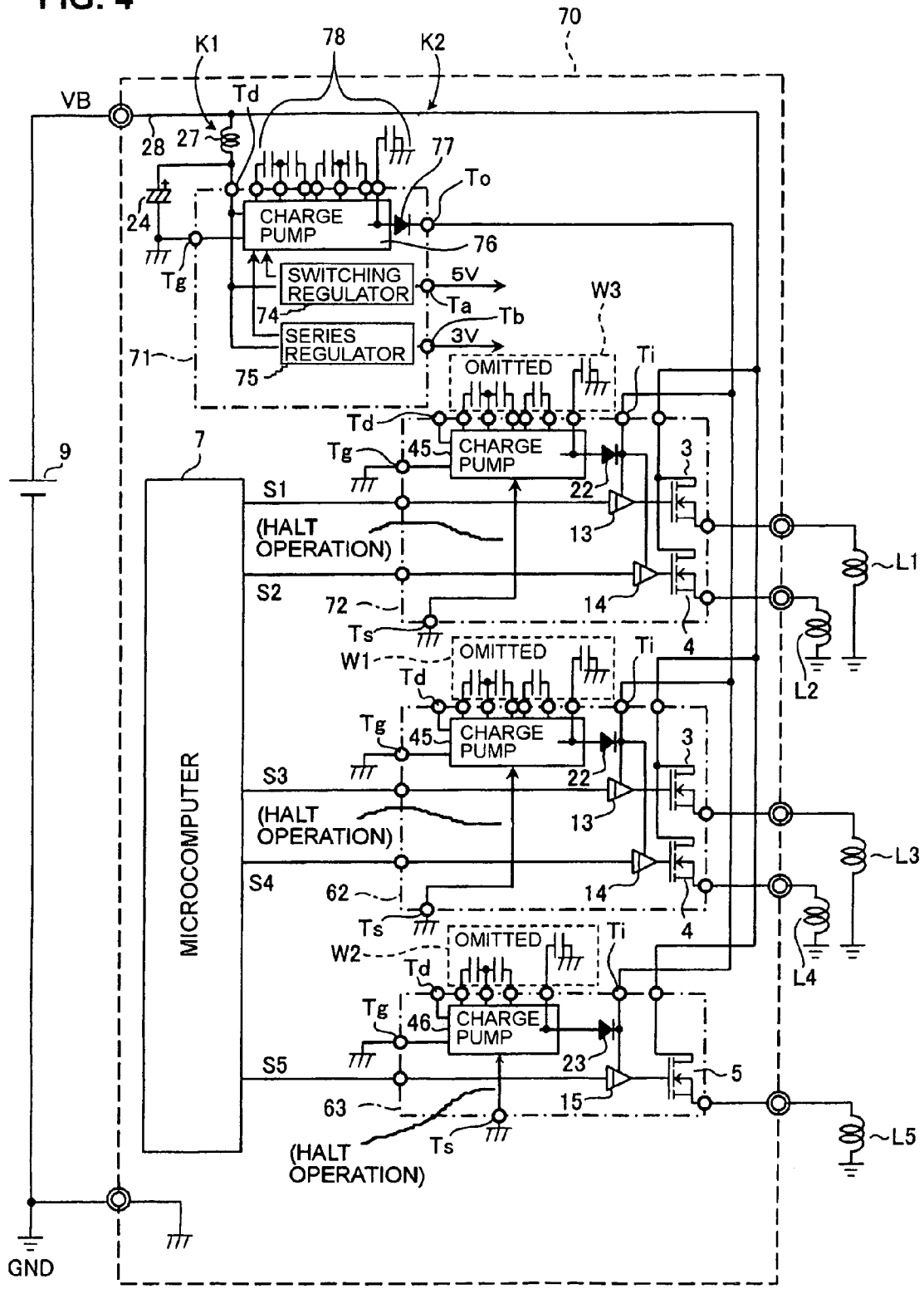
FIG. 4 is a circuit diagram of a third embodiment of an electronic control apparatus.

A third embodiment of an ECU will be described referring to FIG. 4. In FIG. 4, elements, signals and voltages having identical functions to those of FIG. 3 and FIG. 4 are indicated by identical reference designations to those of FIGS. 3 and 4, and detailed description of these will be omitted.

As shown in FIG. 4, an ECU 70 of this third embodiment differs from the ECU 60 of the second embodiment with respect to the following points (3-1) to (3-4):

(3-1) Firstly, a charge pump circuit 76 is incorporated within a power supply IC 71, for generating a stepped-up voltage that is supplied to operate various circuits within the ECU 70.

The power supply IC 71 is provided with a power source terminal Td for receiving the battery voltage VB, a ground terminal Tg that is connected to ground potential, a switching regulator 74 (i.e., a switching-type power supply apparatus) that operates from the battery voltage VB inputted to the power source terminal Td to generate a 1st fixed voltage (with this embodiment, 5 V) that is supplied to an output terminal Ta, a series regulator 75 (i.e., series-type power supply apparatus) which operates from the battery voltage VB inputted to the power source terminal Td to generate a 2nd fixed voltage (with this embodiment, 3 V), that is supplied to an output terminal Tb, a charge pump circuit 76 which generates a stepped-up voltage that is higher than VB, from the battery voltage VB that is inputted to the power source terminal Td, and supplies the stepped-up voltage to an output terminal To, and a diode 77 having the cathode connected to receive the stepped-up voltage from the charge pump circuit 76, for transferring the stepped-up voltage to the output terminal To while preventing current from flowing back into the charge pump circuit 76.

It will be assumed by way of example that the 1st fixed voltage that is outputted from the terminal Ta is supplied as an operating voltage to the microcomputer 7, which performs control processing for controlling the solenoids L1 to L5, while the 2nd fixed voltage that is produced from the output terminal Tb is supplied to peripheral circuits of the microcomputer 7 as an operating voltage. However it would be equally possible for the 1st fixed voltage from the output terminal Ta to be supplied as the operating voltage of the peripheral circuits while the 2nd fixed voltage from output terminal Tb could be supplied as the operating voltage of the microcomputer 7.

Each of the regulators 74 and 75 is configured to output a signal that will be referred to as a condition signal, which indicates whether or not the corresponding fixed voltage is being outputted normally therefrom. The charge pump circuit 76 is configured such as to halt generating of the stepped-up voltage if the condition signal from at least one of the regulators 74 or 75 indicates abnormal operation.

In the same way as for the driver IC 61 of FIG. 3, the power supply IC 71 of this embodiment has a set of capacitors 78 externally connected thereto, to serve as the aforementioned stepped-up voltage generating capacitors and stepped-up voltage output capacitor of the charge pump circuit 76.

Similarly, the power supply IC 71 of this embodiment has a capacitor 24 connected between the terminals Td and Tg, and an inductor 27 connected between the power source terminal Td and the common power source line 28, to suppress generation of electrical noise.

(3-2) A driver IC 72, having the same configuration as the driver IC 62, is used in this embodiment in place of the driver IC 61 of the third embodiment, to drive the solenoids L1, L2. Hence the pre-drive circuits 13, 14 of the driver IC 72 operate in accordance with command signals S1, S2 produced from the microcomputer 7.

In the ECU 70, the charge pump circuit 45 of the driver IC 72 is assumed to be held in the inoperative condition, due to the fact that (as indicated by the broken-line rectangle) the stepped-up voltage generating capacitors and stepped-up voltage output capacitor of the charge pump circuit 45 are omitted from being externally connected to the driver IC 72, in the same way as for the driver ICs 62, 63. Furthermore in addition to the power source terminal Td of the driver IC 72 being left in the open-circuit condition, the selector terminal Ts is connected to ground potential.

(3-3) The stepped-up voltage output terminal To of the power supply IC 71 is connected to the stepped-up voltage input terminal Ti of each of the other driver ICs 72, 62 and 63, so that the stepped-up voltage generated by the charge pump circuit 76 of the power supply IC 71 is supplied to each of these other driver Internal control signal.

With this configuration, in the same way as for the ECU 40 and ECU 60 of the first and second embodiments, it is unnecessary to provide noise suppression elements that are coupled to the power source terminal Td of each of the driver ICs 72, 62. 63 which receive the stepped-up voltage from the power supply IC 71 as described above.

Hence, it is not necessary to provide any special components for suppressing electrical noise resulting from generating of the stepped-up voltage, other than the noise suppression elements of the power supply IC 71. In addition, stable fixed voltages are supplied to the microcomputer 7 and to peripheral circuits from the power supply IC 71, and the capacitor 24 and the inductor 27 (i.e., the noise suppression elements that are connected to the power supply IC 71) also serve to effectively suppress the generating of electrical noise by the regulators 74 and 75, in particular noise that is generated by the switching regulator 74. Hence, a high degree of compactness and low manufacturing cost can be achieved with this embodiment.

It is not essential that the regulators 74 and 75 are both incorporated in the power supply IC 71, and it would be equally possible to incorporate only one of these. If at least the switching regulator 74 is incorporated within the power supply IC 71, highly effective suppression of noise produced by the switching regulator 74 is achieved by the LC filter that is connected to the power source terminal Td, constituted by the capacitor 24 and the inductor 27, with this filter also serving in common to suppress the noise that is produced in generating the stepped-up voltage by the charge pump circuit 76. Hence, a substantial reduction in the overall level of generated noise can be achieved.

With the ECU 70 of the third embodiment, the same effects (a) to (c) described above for the ECU 60 are also obtained. Furthermore with the ECU 70 of the third embodiment, in the same way as for the driver IC 61 of the second embodiment, one or both of the aforementioned capacitor and resistor that determine the operation frequency of the charge pump circuit 76 within the power supply IC 71 could be connected externally, so that the advantage (d) could also be obtained.

Moreover with the ECU 70 of the third embodiment, if the condition signal produced from either of the regulators 74 or 75 indicates abnormal operation, then the stepped-up voltage generating operation of the charge pump circuit 76 is halted. Hence, if the 1st or 2nd fixed voltage ceases to be produced normally from the power supply IC 71, so that normal operation of the microcomputer 7 or peripheral circuits cannot be ensured (and hence, normal operation of the ECU 70 is not ensured) then the stepped-up voltage ceases to be produced from the charge pump circuit 76, and each of respective N-channel MOS FETs 3, 4, and 5 within the driver ICs 72, 62 and 63 are thereby held in the off (i.e., non-conducting) condition, so that unnecessary driving of the solenoids L1 to L5 is prevented. Stability of operation is thereby enhanced and unnecessary power consumption is prevented. However this effect is achieved without requiring to add components, or to increase the chip area (i.e., land size) of any IC.

Furthermore with the ECU 70 of the third embodiment, with duty ratio control of fixed-frequency switching being used to drive the solenoids L1, L2, the operating frequency of the charge pump circuit 76 is made at least 10 times the drive frequency of the solenoids L1, L2. However in the same way as for the ECU 40 of the first embodiment, the circuit path of the battery voltage VB has at least two branches, i.e., the first power supply path K1 that is connected to the power source terminal Td of the power supply IC 71, for supplying the charge pump circuit 76 and the regulators 74, 75, and the second power supply path K2 that is a conduction path for the solenoids L1 to L5, with the inductor 27 being connected in the first power supply path K1 as a noise suppression element, thereby effectively suppressing the emission of noise from external power supply leads (e.g., wiring harness) that are connected to the common power source line 28 and from the connecting leads between the solenoids L1 to L5 and the N-channel MOS FETs 3, 4, and 5.

It should further be noted that with each of the ECUs 40, 60 and 70 of the first to third embodiments, it would be possible to configure each of the corresponding driver ICs 41, 61, 71 such that a circuit element which determines a target value of stepped-up voltage to be produced from the corresponding charge pump circuit (44 or 76) is provided as a component that is connected externally to the driver IC.

Figure 5:
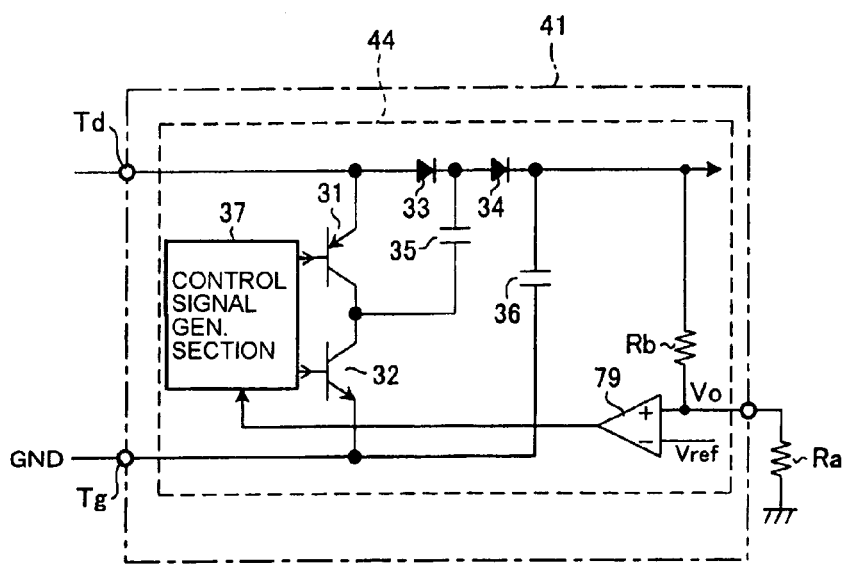
FIG. 5 is a circuit diagram showing an alternative configuration of a charge pump circuit of the first, second or third embodiments.

This will be described referring to the driver IC 41 of the ECU 40 of the first embodiment, for example. It will be assumed that this has the circuit configuration shown in FIG. 5, which is a modification of the configuration shown in FIG. 7A described hereinabove. In FIG. 5, elements corresponding to those of FIG. 7A are indicated by identical reference designations to those of FIG. 7A, and detailed description of these will be omitted. As shown in FIG. 5, the charge pump circuit 44 includes a resistive voltage divider formed of resistors Ra and Rb connected across the stepped-up voltage, so that a divided voltage Vo appears at the junction of Ra, Rb. A comparator 79 is provided, which compares the voltage Vo with a reference voltage Vref, and supplies a resultant output signal to the control signal generating section 37. The control signal generating section 37 is configured such as to be controlled to perform switching of the switching elements 31, 32 between the on and off states so long as the output signal from the comparator 79 indicates that Vo<Vref, and to halt the switching of the switching elements 31, 32 when that output signal from the comparator 79 indicates that Vo≦Vref. In addition, a target value of the stepped-up voltage that is produced from the charge pump circuit 44 is determined by the level of the output signal from the comparator 79.

It can thus be understood that with this circuit configuration, feedback control is applied, from the output of the comparator 79, whereby the stepped-up voltage can be fixed at a target value which is lower than the maximum (i.e., no-load) value of the stepped-up voltage, with that target value being determined by the voltage Vo, i.e., by the value of the resistor Ra. That is to say, if the output current of the circuit is successively increased from zero, the stepped-up voltage will remain fixed at the target value until the current level becomes excessive.

With such a configuration, it becomes possible to provide one or both of the resistors Ra, Rb components that are connected externally to the driver IC 41. In the example of FIG. 5, the resistor Ra is assumed to be externally connected. As can be understood from the above, Ra is one of the elements that determine the target value of stepped-up voltage, i.e., the smaller the value of Ra, the higher will be the value of stepped-up voltage that is generated, and conversely, the greater the value of Ra, the lower will be the stepped-up voltage value.

By providing a target voltage-determining element as an externally connected element in that way, it becomes possible to meet requirements for various values of stepped-up voltage to be produced, and if the specified value of stepped-up voltage becomes changed, then this can easily be handled. In addition, each of the driver ICs 41, 61 and 71 can readily be used in a multi-purpose type of ECU, so that manufacturing costs can be lowered.

It should be noted that in general, the higher the value of stepped-up voltage that is produced by a charge pump circuit, the greater will become the level of electrical noise that is generated. However by setting the maximum value of stepped-up voltage appropriately by selecting a suitable value for the target voltage-determining element, then if for example the electronic control apparatus is to be used in an application requiring a lower drive capability for the charge pump circuit (i.e., less current will be supplied from the charge pump circuit to drive the gate electrodes of N-channel MOS FETs) there will be no increase in the stepped-up voltage beyond the target value. Thus in such a case, the level of generated noise can be substantially reduced, while in addition, less expense will be incurred in providing components as noise suppression elements.

It should be noted that various modifications could be envisaged to the embodiments described in the above.

For example, any of the driver ICs 41, 61, 71 of the ECUs 40, 60 and 70 of the described embodiments could be configured with one or more input terminals coupled to receive respective external control signals, such that the operating frequency and/or the target value of stepped-up voltage of the corresponding charge pump circuit 44 or 46 could be adjusted in accordance with the externally supplied control signal(s). If that were to be done, then it would be possible to omit the use of externally connected components such as the capacitor 69 shown in FIG. 3 and/or the resistor Ra shown in FIG. 5, so that space saving and lower manufacture cost could be achieved.

Furthermore with the above embodiments, each of the driver ICs 41, 61, 71 of the ECUs 40, 60 and 70 has a power source terminal Td which has an inductor 27 and capacitor 24 directly connected thereto as noise suppression elements. However it would be equally possible to provide only one of these, i.e., either the capacitor 24 or the inductor 27.

Moreover although the above embodiments have been described for the case in which the N-channel MOS FETs 1, 2, etc., are provided internally within the driver ICs IC 41 etc., it would be equally possible to provide these N-channel MOS FETs 1 to 5 as external components that are connected to the corresponding driver ICs.

Moreover although the above embodiments have been described for the case in which each voltage step-up circuit is a charge pump circuit, it would be equally possible to use another type of voltage step-up circuit, such as a circuit based on a step-up transformer, i.e., where an AC voltage generated by an oscillator circuit is applied to a primary winding of the transformer and a high AC voltage from the secondary winding of the transformer is rectified to obtain the stepped-up voltage. However use of a charge pump circuit is preferable, in that all of the components of the circuit can be formed within an integrated circuit.

It should be further noted that the type of load that can be driven is not limited to solenoids, and that similar effects could be obtained when driving electric motors, lamps, etc.

What is claimed is:

1. An electronic control apparatus comprising:
   a main integrated circuit, comprising:
      a power source input terminal coupled to recieve an externally supplied power source voltage,
      a voltage step-up circuit operating from said power source voltage supplied to said power source input terminal to produce a stepped-up voltage that is higher than said power source voltage, and
      a stepped-up voltage output terminal coupled to receive said stepped-up voltage; and
   at least one auxiliary integrated circuit, comprising:
      a stepped-up voltage input terminal coupled to receive said stepped-up voltage from said stepped-up voltage terminal of said main integrated circuit,
      a first drive circuit for selectively applying said stepped-up voltage to a gate electrode of a first MOS FET (metal-oxide semiconductor field effect transistor) that is connected in a current flow path of a first electrical load, to effect on and off switching of said first MOS FET,
      a second drive circuit for selectively applying said stepped-up voltage to a gate electrode of a second MOS FET that is connected in a current flow path of a second electrical load, to effect on and off switching of said second MOS FET, and
   a noise reduction circuit connected to said power source input terminal of said main integrated circuit but unconnected to said at least one auxiliary integrated circuit;
   wherein: said at least one auxiliary integrated circuit comprises a second power source input terminal coupled to receive said externally supplied power source voltage, and a second voltage step-up circuit operating from said power source voltage supplied to said second power source input terminal to produce a second stepped-up voltage that is higher than said power source voltage;
      said second voltage step-up circuit is selectively set in an operative condition and an inoperative condition in accordance with whether or not a constituent element of said second voltage step-up circuit is connected to said auxiliary integrated circuit as an external component; and
   when said second voltage step-up circuit is in said operative condition, said first drive circuit selectively applies said second stepped-up voltage to said gate electrode of said first MOS FET to effect said on and off switching of said first MOS FET, and said second drive circuit selectively applies said second stepped-up voltage to said gate electrode of said second MOS FET to effect said on and off switching of said second MOS FET.

2. An electronic control apparatus as claimed in claim 1, wherein said voltage step-up circuit comprises a charge pump circuit which performs switching of charges between a plurality of capacitors to generate said stepped-up voltage, and wherein said constituent element that is connectable to said at least one auxiliary integrated circuit as an external component comprises at least one of said capacitors of said charge pump circuit.

3. An electronic control apparatus as claimed in claim 1, wherein:
   said at least one auxiliary integrated circuit comprises a second power source input terminal coupled to receive said externally supplied power source voltage, a control signal input terminal, a second voltage step-up circuit operating from said power source voltage supplied to said second power source input terminal to produce a second stepped-up voltage that is higher than said power source voltage;
   said second voltage step-up circuit is selectively set in an operative condition and an inoperative condition in accordance with whether or not a predetermined signal is being externally applied to said control signal input terminal; and
   when said second voltage step-up circuit is in said operative condition, said first drive circuit selectively applies said second stepped-up voltage to said gate electrode of said first MOS FET to effect said on and off switching of said first MOS FET, and said second drive circuit selectively applies said second stepped-up voltage to said gate electrode of said second MOS FET to effect said on and off switching of said second MOS FET.

4. An electronic control apparatus comprising:
   a main integrated circuit, comprising:
      a power source input terminal coupled to receive an externally supplied power source voltage,
      a voltage step-up circuit operating from said power source voltage supplied to said power source input terminal to produce a stepped-up voltage that is higher than said power source voltage,
a stepped-up voltage output terminal coupled to receive said stepped-up voltage, and
a conductive path connected to the stepped-up voltage output terminal and extending externally from the main integrated circuit, and through which the stepped-up voltage is supplied; and
at least one auxiliary integrated circuit, comprising:
a stepped-up voltage input terminal coupled to receive said stepped-up voltage from said stepped-up voltage output terminal of said main integrated circuit through the conductive path,
a first drive circuit for selectively applying said stepped-up voltage to a gate electrode of a first MOS FET (metal-oxide semiconductor field effect transistor) that is connected in a current flow path of a first electrical load, to effect on and off switching of said first MOS FET,
a second drive circuit for selectively applying said stepped-up voltage to a gate electrode of a second MOS FET that is connected in a current flow path of a second electrical load, to effect on and off switching of said second MOS FET, wherein the first and second drive circuits receive the stepped-up voltage via the conductive path connected to the stepped-up voltage output terminal, and
a second power source input terminal coupled to receive said externally supplied power source voltage, and a second voltage step-up circuit operating from said power source voltage supplied to said second power source input terminal to produce a second stepped-up voltage that is higher than said power source voltage; and
a noise reduction circuit connected to said power source input terminal of said main integrated circuit but unconnected to said at least one auxiliary integrated circuit;
a control circuit for generating a command signal to control driving of said first and second electrical loads,
a power supply circuit coupled to receive said power source voltage from said power source voltage input terminal, for converting said power source voltage to an operating voltage, and
an operating voltage output terminal coupled to receive said operating voltage;
wherein said operating voltage is supplied from said operating voltage output terminal to said control circuit, for operating said control circuit, and said control circuit generates the command signal for controlling said drive circuit to selectively apply said stepped-up voltage to said gate electrodes of said first and second MOS FETs,
said at least one auxiliary integrated circuit comprises a second power source terminal coupled to receive said externally supplied power source voltage, and a second voltage step-up circuit operating from said power source voltage supplied to said second power source terminal to produce a second stepped-up voltage that is higher than said power source voltage;
for said at least one auxiliary integrated circuit, said second voltage step-up circuit is selectively set in an operative condition and an inoperative condition in accordance with whether or not a constituent element of said second voltage step-up circuit is connected to said auxiliary integrated circuit as an external component; and
when said second voltage step-up circuit is in said operative condition, each of said drive circuit of said auxiliary integrated circuit selectively applies said second stepped-up voltage to the gate electrode of a corresponding MOS FET to effect said on and off switching of said MOS FET.

5. An electronic control apparatus comprising:
a main integrated circuit, comprising:
a power source input terminal coupled to recieve an externally supplied power source voltage,
a voltage step-up circuit operating from said power source voltage supplied to said power source input terminal to produce a stepped-up voltage that is higher than said power source voltage, and
a stepped-up voltage output terminal coupled to receive said stepped-up voltage; and
at least one auxiliary integrated circuit, comprising:
a stepped-up voltage input terminal coupled to receive said stepped-up voltage from said stepped-up voltage output terminal of said main integrated circuit,
a first drive circuit for selectively applying said stepped-up voltage to a gate electrode of a first MOS FET (metal-oxide semiconductor field effect transistor) that is connected in a current flow path of a first electrical load, to effect on and off switching of said first MOS FET, and
a second drive circuit for selectively applying said stepped-up voltage to a gate electrode of a second MOS FET that is connected in a current flow path of a second electrical load, to effect on and off switching of said second MOS FET, and
a noise reduction circuit connected to said power source input terminal of said main integrated circuit
wherein: said at least one auxiliary integrated circuit comprises a second power source input terminal coupled to receive said externally supplied power source voltage, and a second voltage step-up circuit operating from said power source voltage supplied to said second power source input terminal to produce a second stepped-up voltage that is higher than said power source voltage;
said second voltage step-up circuit is selectively set in an operative condition and an inoperative condition in accordance with whether or not a constituent element of said second voltage step-up circuit is connected to said auxiliary integrated circuit as an external component; and
when said second voltage step-up circuit is in said operative condition, said first drive circuit selectively applies said second stepped-up voltage to said gate electrode of said first MOS FET to effect said on and off switching of said first MOS FET, and said second drive circuit selectively applies said second stepped-up voltage to said gate electrode of said second MOS FET to effect said on and off switching of said second MOS FET.

6. An electronic control apparatus as claimed in claim 5, wherein said second voltage step-up circuit comprises a charge pump circuit which performs switching of charges between a plurality of capacitors to generate said stepped-up voltage, and wherein said constituent element that is connectable to said at least one auxiliary integrated circuit as an external component comprises at least one of said capacitors of said charge pump circuit.

7. An electronic control apparatus as claimed in claim 6, wherein:
said at least one auxiliary integrated circuit comprises a second power source input terminal coupled to receive said externally supplied power source voltage, a control signal input terminal, a second voltage step-up circuit operating from said power source voltage supplied to said second power source input terminal to produce a second stepped-up voltage that is higher than said power source voltage;

said second voltage step-up circuit is selectively set in an operative condition and an inoperative condition in accordance with whether or not a predetermined signal is being externally applied to said control signal input terminal; and when said second voltage step-up circuit is in said operative condition, said first drive circuit selectively applies said second stepped-up voltage to said gate electrode of said first MOS FET to effect said on and off switching of said first MOS FET, and said second drive circuit selectively applies said second stepped-up voltage to said gate electrode of said second MOS FET to effect said on and off switching of said second MOS FET.

8. An electronic control apparatus comprising:

a main integrated circuit, comprising:
- a power source input terminal coupled to receive an externally supplied power source voltage,
- a voltage step-up circuit operating from said power source voltage supplied to said power source input terminal to produce a stepped-up voltage that is higher than said power source voltage,
- a stepped-up voltage output terminal coupled to receive said stepped-up voltage, and
- a conductive path connected to the stepped-up voltage output terminal and extending externally from the main integrated circuit, and through which the stepped-up voltage is supplied; and a plurality of auxiliary integrated circuits each comprising:
- a stepped-up voltage input te nnal coupled to receive said stepped-up voltage from said stepped-up voltage output terminal of said main integrated circuit through the conductive path,
- a plurality of drive circuits, each of said drive circuits selectively applying said stepped-up voltage to a gate electrode of a corresponding MOS FET (metal-oxide semiconductor field effect transistor) that is connected in a current flow path of a corresponding electrical load, to effect on and off switching of said corresponding MOS FET, wherein the plurality of drive circuits receive that stepped-up voltage via the conductive path connected to the stepped-up voltage output terminal, and
- a second power source input terminal coupled to receive said externally supplied power source voltage, and a second voltage step-up circuit operating from said power source voltage supplied to said second power source input terminal to produce a second stepped-up voltage that is higher than said power source voltage; and
- a noise reduction circuit connected to said power source input terminal of said main integrated circuit.

9. An electronic control apparatus comprising a control circuit for generating command signals to separately control driving of respective ones of a plurality of electrical loads, wherein said electronic control apparatus comprises:

a main integrated circuit, said main integrated circuit comprising:
- a power source input terminal coupled to receive an externally supplied power source voltage,
- a voltage step-up circuit operating from said power source voltage supplied to said power source input terminal to produce a stepped-up voltage that is higher than said power source voltage,
- a stepped-up voltage output terminal coupled to receive said stepped-up voltage,
- a power supply circuit coupled to receive said power source voltage from said power source voltage input terminal, for converting said power source voltage to an operating voltage,
- an operating voltage output terminal coupled to receive said operating voltage,
- a conductive path connected to the stepped-up voltage output terminal and extending externally from the main integrated circuit, and through which the stepped-up voltage is supplied; and a plurality of auxiliary integrated circuits, each comprising:
- a stepped-up voltage input terminal coupled to receive said stepped-up voltage from said stepped-up voltage output terminal of said main integrated circuit through the conductive path,
- a plurality of drive circuits, each controlled by a corresponding one of said command signals for selectively applying said stepped-up voltage to a gate electrode of a corresponding MOS FET (metal-oxide semiconductor field effect transistor) that is connected in a current flow path of a corresponding one of said plurality of electrical loads, to effect on and off switching of said corresponding MOS FET, wherein the plurality of drive circuits receive the stepped-up voltage via the conductive path connected to the stepped up voltage output terminal, and
- a second power source input terminal coupled to receive said externally supplied power source voltage, and a second voltage step-up circuit operating from said power source voltage supplied to said second power source input terminal to produce a second stepped-up voltage that is higher than said power source voltage; and
- a noise reduction circuit connected to said power source input terminal of said main integrated circuit.

* * * * *